United States Patent
Bhattacharya et al.

(10) Patent No.: US 11,620,424 B2
(45) Date of Patent: Apr. 4, 2023

(54) TRANSISTOR—LEVEL DEFECT COVERAGE AND DEFECT SIMULATION

(71) Applicant: Synopsys, Inc., Mountain View, CA (US)

(72) Inventors: Mayukh Bhattacharya, Palo Alto, CA (US); Sayandeep Sanyal, Hooghly (IN); Amit Patra, Kharagpur (IN); Pallab Dasgupta, Kharagpur (IN)

(73) Assignee: Synopsys, Inc., Mountain View, CA (US)

(*) Notice: Subject to any disclaimer, the term of this patent is extended or adjusted under 35 U.S.C. 154(b) by 42 days.

(21) Appl. No.: 17/450,899

(22) Filed: Oct. 14, 2021

(65) Prior Publication Data
US 2022/0121799 A1     Apr. 21, 2022

Related U.S. Application Data

(60) Provisional application No. 63/092,878, filed on Oct. 16, 2020.

(51) Int. Cl.
| | | |
|---|---|---|
| *G06F 30/3308* | (2020.01) | |
| *G06F 30/333* | (2020.01) | |
| *G06F 30/337* | (2020.01) | |
| *G06F 30/373* | (2020.01) | |
| *G06F 30/398* | (2020.01) | |

(52) U.S. Cl.
CPC ........ *G06F 30/3308* (2020.01); *G06F 30/333* (2020.01); *G06F 30/337* (2020.01); *G06F 30/373* (2020.01); *G06F 30/398* (2020.01)

(58) Field of Classification Search
CPC ............ G06F 30/3308; G06F 30/333; G06F 30/337; G06F 30/373; G06F 30/398

USPC .......... 716/112, 105, 106, 132, 136; 703/14
See application file for complete search history.

(56) References Cited

U.S. PATENT DOCUMENTS

| | | | | |
|---|---|---|---|---|
| 5,917,728 | A * | 6/1999 | Ueda ..................... | G06F 30/327 |
| | | | | 716/108 |
| 10,846,455 | B2 * | 11/2020 | Ghosh ..................... | G06F 30/20 |
| 2016/0085898 | A1 * | 3/2016 | Manohar ............... | G06F 30/392 |
| | | | | 716/124 |
| 2021/0312113 | A1 * | 10/2021 | Bhattacharya ...... | G06F 30/3323 |
| 2021/0326227 | A1 * | 10/2021 | Bhattacharya ... | G01R 31/31835 |
| 2021/0326506 | A1 * | 10/2021 | Bhattacharya ........ | G06F 30/367 |
| 2022/0092244 | A1 * | 3/2022 | Rahim ................ | G06F 30/3323 |
| 2022/0100937 | A1 * | 3/2022 | Maamari ............... | G06F 30/327 |

OTHER PUBLICATIONS

Arinik et al., "Multiplicity and Diversity: Analyzing the Optimal Solution Space of the Correlation Clustering Problem on Complete Signed Graphs", https://arxiv.org/pdf/2011.05196.pdf, Aug. 9, 2021, 19 pages. (Year: 2021).*

* cited by examiner

*Primary Examiner* — Phallaka Kik
(74) *Attorney, Agent, or Firm* — Patterson + Sheridan, LLP

(57) ABSTRACT

A system and method utilized to receive an integrated circuit (IC) design and generating a graph based on a plurality of sub-circuits of the IC design. Further, one or more candidate sub-circuits are determined from the plurality of sub-circuits based on the graph. Additionally, one or more sub-circuits are identified from the one or more candidate sub-circuits based on a number of transistors and a number of edges within each of the plurality of sub-circuits. An indication of the identified one or more sub-circuits is provided.

20 Claims, 16 Drawing Sheets

400 ↘

| Circuit | # of Circuit Nodes | # Input/ Output Ports | Independent CCGS | Internal Observation Point |
|---|---|---|---|---|
| Circuit 410 | 5 | 2/2 | 1,3 | 3 |
| Circuit 420 | 10 | 3/2 | 9,6,7,1 | 9 |
| | | | 8,2,3 | 8 |
| | | | 4,5 | 5 |
| Circuit 430 | 20 | 4/3 | 1,6 | 6 |
| | | | 2,3,17 | 17 |
| | | | 4,20,9,12, 14,7,6,21 | 21 |

Input: CCG of circuit, G = (V,E), where
V= {$v_1, v_2, v_3, ...., v_n$} is the set of vertices, and
E= {$e_1, e_2, e_3, ......, e_m$} is the set of nodes
Output: Independent sub-graphs of G 1. Identify vertices {$V_1, V_2, ..., V_p$} in G with no incoming edges.
2. $V^I = \{V^I_1, V^I_2, ..., V^I_p\}$, $\forall^p_{i=1} V^I_i = \{v_i\}$ ;
3. $E^I = \{E^I_1, E^I_2, ..., E^I_p\}$, $\forall^p_{i-1} E^I_i = \emptyset$ ;
4. for each vertex $v^I_i \in V^I$ do
5.     while new vertex is added to $V^I_i$ do
6.         v = DFS(G,$v_i$);// DFS traversal in G starting from $v_i \in V^I_i$
7.         if v has incoming edges only from vertives in $V^I_i$ then
8.             $V^I_i = V^I_i + \{v\}$;
9.     for each $e_k = \{v_a, v_b\} \in E$ do
10.         If $v_a \in V^I_i$ && $v_b \in V^I_i$ then
11.             $E^I_i = E^I_i + \{e_k\}$ ;
12. Return $(V^I_1, E^I_1), (V^I_2, E^I_2), (V^I_3, E^I_3), ..., (V^I_p, E^I_p)$;

FIG. 5

```
real clk_ana, upperLimit_range_0, lowerLimit_range_0,
presentValue_range_0;
ref clk_ref ;
initial begin
  upperLimit_range_0 = 0.001000;
  lowerLimit_range_0 = -0.001000;
  clk_ref=1'b0;
  $initialCall( 1, 0, 0, 0 );
end analog begin
      clk_ana=1.0 - clk_ana;
end
always@(absdelta(clk_ana, 50m, 1p, 10m)) begin
  If ((clk_ana == 1.0)  || (clk_ana == 0.0)) begin
      clk_ref = ~clk_ref;
    end
  end /******** Monitoring Range of V(I1. net1) *******/
always@(clk_ref) begin
    presentValue_range_0 = V(I1. net1);

If(presentValue_range_0 > upperLimit_range_0) begin
  $rangeCall(0, $abstime, +1, upperLimit_range_0, lowerLimit_range_0);
    end
    if(presentValue_range_0< lowerLimit_range_0) begin
      $rangeCall(0, $abstime, -1, upperLimit_range_0, lowerLimit_range_0);
    end
end
```

FIG. 7

| Circuits | No. of Tran--sistors | No. of Faults Injected | Sensitive Internal Nets | Detected by our Approach Output Port | Detected by our Approach Internal Net | Total no. of Faults Covered | Percentage Fault Coverage | Time Taken (sec) First Approach | Time Taken (sec) Second Approach | Percentage Reduction in Time Taken |
|---|---|---|---|---|---|---|---|---|---|---|
| LDO | 67 | 68 | Net096, Net086 | 29 | 32 | 61 | 89.7 | 118.3 | 46.7 | 60.50 |
| OPAMP1 | 14 | 39 | Net27, Net12 | 22 | 12 | 35 | 89.7 | 19.8 | 13.7 | 30.80 |
| COMP1 | 21 | 60 | Net125 | 27 | 26 | 53 | 88.3 | 29.9 | 22.6 | 24.41 |
| PLL1 | 298 | 98 | VCOin | 76 | 16 | 92 | 93.9 | 33614 | 14504 | 56.85 |
| DAC8B1 | 472 | 132 | - | 93 | 0 | 93 | 70.5 | 54.4 | 42.1 | 22.61 |
| ADC8B1 | 1560 | 257 | comp | 186 | 36 | 222 | 86.4 | 282 | 159 | 43.62 |

FIG. 8

TRANSISTOR—LEVEL DEFECT COVERAGE AND DEFECT SIMULATION

RELATED APPLICATION

This application claims the benefit of U.S. provisional patent application Ser. No. 63/092,878, filed Oct. 16, 2020, which is hereby incorporated herein by reference.

TECHNICAL FIELD

The present disclosure relates to defect coverage and defect simulation based on the sub-circuits of an integrated circuit design.

BACKGROUND

The performance of Integrated circuits (ICs) is simulated to detect how the ICs function in the presence of faults. In many instances, the function of an IC is observed while faults are injected to determine the fault (e.g., defect) coverage. In many instances, an IC is a mixed signal IC, having both analog circuits and digital circuits. In such instances, the fault coverages for both the analog and digital circuits are determined by injecting faults and observing the performance of the IC. In digital fault simulation, improvements in the testing, and/or design-for-testability have decreased the frequency of failures in the digital components, such that failures in the digital components occur less frequently than failures in analog components of the IC. Accordingly, in a mixed signal IC application, the majority of failures are attributed to the analog circuits.

SUMMARY

In one example, a method includes receiving an integrated circuit (IC) design and generating, by one or more processors, a graph based on a plurality of sub-circuits of the IC design. Further, the method includes determining, by the one or processors, one or more candidate sub-circuits from the plurality of sub-circuits based on the graph. Additionally, the method includes identifying, by the one or more processors, one or more sub-circuits from the one or more candidate sub-circuits based on a number of transistors and a number of edges within each of the plurality of sub-circuits. The method further includes providing an indication of the identified one or more sub-circuits.

In one example, a system includes a memory storing instructions, and a processor coupled with the memory and configured to execute the instructions. The instructions when executed cause the processor to receive a digital design file of an IC design and generate a channel-connected graph based on a plurality of sub-circuits of the IC design. Further, the instructions when executed cause the processor to determine one or more candidate sub-circuits from the plurality of sub-circuits from the channel-connected graph, and identify one or more sub-circuits from the one or more candidate sub-circuits based on a number of transistors and a number of edges within each of the plurality of sub-circuits. Additionally, the instructions when executed cause the processor to output an indication of the identified one or more sub-circuits.

In one example, a non-transitory computer readable medium including stored instructions, which when executed by a processor, cause the processor to receive an IC design and generate a graph for a plurality of sub-circuits of the IC design. Further, the processor is caused to determine one or more candidate sub-circuits from the plurality of sub-circuits from the graph and identify one or more sub-circuits from the one or more candidate sub-circuits based on a number of transistors and a number of edges within each of the plurality of sub-circuits. Additionally, the processor is caused to provide an indication of the identified one or more sub-circuits.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4 depicts a table of circuit properties, according to one or more examples.

FIG. 5 depicts an algorithm for identifying sub-circuits, according to one or more examples.

FIG. 7 depicts example code for detecting sensitive nets, according to one or more examples.

FIG. 8 depicts a table of circuit properties, according to one or more examples.

DETAILED DESCRIPTION

Figure 1:
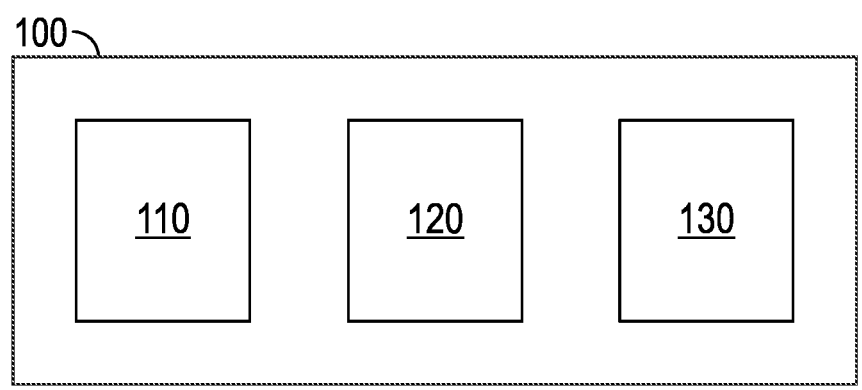
FIG. 1 illustrates a schematic block diagram of a simulation system, according to one or more examples.

Aspects of the present disclosure relate to transistor-level defect coverage and defect simulation.

Improving the ability to detect faults within an analog circuit portion of an integrated circuit (IC) design improves defect coverage and/or fault coverage simulation of the IC design. Further, by identifying defects and/or faults that may be simultaneously simulated, the amount of time utilized for defect and/or fault simulation of the analog circuits of the IC design is reduced. Additionally, or alternatively, detecting defects during the design process may decrease the number of defected IC chips that are returned from the field, decreasing the manufacturing costs of the IC chips while increasing the reliability and performance of electronic devices in which IC chips are utilized. The number of defective IC chips may be determined based on $DL=1-Y^{(1-TC)}$, where DL=Defect Level, Y=Yield, and TC=Test Coverage.

High test coverage with a number of simulations smaller than the size of the fault universe is achieved by partitioning the analog circuit of a mixed-signal IC design (e.g., an IC design that includes analog and digital circuitry) into smaller sub-circuits and then identifying and ranking fault-sensitive internal nets based on the smaller sub-circuits. High test coverage may correspond to testing at least ninety percent of the faults. For example, if an IC design has 10,000 transistors, the size of the fault universe may be around 50,000. In one or more examples, around 50,000 simulations may be needed to test each of the faults. However, by using concurrent fault simulation, as is described in the following, the simulation count is reduced. In one example, the simulation count may be reduced by about fifty percent or more.

In many instances, the determination of the analog fault coverage corresponds to the ability to observe the functionality of the analog circuit portion of an IC design. Accordingly, improving the observability of an analog circuit portion an IC design improves the ability to determine the analog fault coverage. In one example, improving the observability of the analog fault coverage includes identifying fault-sensitive nets of the IC design. A net is a collection of two or more interconnected components. In one example, for N nets, $N=\{n_1, n_2, \ldots, n_k\}$. The number of nets present in the design under test (DUT) (e.g., an IC design) is k, where k is three or more. $N_A \subseteq N$ is the set of nets that are accessible from outside through output ports. However, the set of nets $N_A$ may not be sufficient to determine the analog fault coverage of the corresponding IC design (e.g., DUT). In one example, a set of sensitive nets, denoted by the set $N_s$, consisting of internal nets of the IC design is identified to improve the observability of the analog circuit portion. A sensitive net is a net that when analyzed or probed, two or more faults associated with one or more nets are observable. Each member of the set $N_s$ is a 2-tuple, consisting of the net name and the number of faults detectable at that net. Initially the set $N_s$ is an empty set and identified sensitive nets are added to the set $N_s$. The process for generating the set $N_s$ is described in the following.

Due to the size of the search space for analog test pattern generation, fault coverage testing for an analog circuit is complex. Further, as not all analog faults are observable at the output nets, many current approaches for fault propagation yield unsatisfactory levels of coverage. Analog simulation is commonly performed one-defect-at-a-time and is more computational resource and processing time expensive as compared to digital simulation. Accordingly, the amount of computational resources and processing time needed to perform analog simulation with the large number of test inputs with many faults is prohibitive.

Additionally, the inclusion of advanced driver-assist systems (ADAS) in modern automobiles is increasing as the automotive industry moves towards hands-off-eyes-off autonomous vehicles. As the ICs utilized to execute the ADAS technologies include analog circuits (e.g., have an analog component), fault simulation of critical circuit components is utilized to compute quality metrics (e.g., single-point fault metric (SPFM), latent fault metric (LFM), probabilistic metric for random hardware failures (PMHF)) recommended by functional safety standards (e.g., ISO 26262). Accordingly, fast and accurate analog circuitry fault simulation and/or defect simulation improves manufacturing test coverage, improving functional safety standpoints.

FIG. 1 illustrates a circuit simulation system 100, according to one or more examples. The circuit simulation system 100 includes one or more processors (e.g., a processing device 1102 of FIG. 11) that executes instructions (e.g., instructions 1126 of FIG. 11 stored within a memory (e.g., main memory 1104 or the machine-readable storage medium 1124 of FIG. 11) to receive a digital design file and process the digital design file to identify one or more sub-circuits and/or identify one or more sensitive nets within a corresponding IC design.

As illustrated in FIG. 1, the circuit simulation system 100 includes sub-circuit engine 110, circuit analysis engine 120, and memory 130. The sub-circuit engine 110 includes one or more processors (e.g., a processing device 1102 of FIG. 11) that executes instructions (e.g., instructions 1126 of FIG. 11 stored within a memory (e.g., main memory 1104 or the machine-readable storage medium 1124 of FIG. 11) to receive a digital design file and process the digital design file to identify one or more sub-circuits. In one example, the digital design file is a netlist file of an IC design and the sub-circuit engine 110 receives the netlist file of the IC design and identifies sub-circuits of the IC design from the netlist file. The sub-circuit engine 110 receives the digital design file from the memory 130 and/or another system connected to the circuit simulation system 100. The IC design may be referred to as DUT.

The sub-circuit engine 110 identifies sub-circuits, the sub-circuit engine 110 generates one or more channel-connected graphs (CCGs) of the IC design. Candidate sub-circuits are identified from the CCGs. As will be described in more detail in the following, the sub-circuit engine 110 generates the CCGs at the transistor-level of the IC design. A CCG is a directed graph having one or more nodes. Each node is a channel-connected block (CCB) within the IC design. A CCB provides an indication of the connection of nodes within each sub-circuit of the IC design. Input and output nodes of the CCBs are connected to each other to generate the CCGs. A CCB may also be referred to as a channel-connected component, DC connected component, and a DC connected block, among others.

The candidate sub-circuits are then analyzed to determine a set of sub-circuits for further processing. For example, each of the candidate sub-circuits is analyzed based on a number of transistors and a number of edges within each of the candidate sub-circuits. The sub-circuit engine 110 outputs the identified sub-circuits to the memory 130. In one example, the sub-circuit engine 110 additionally, or alternatively, outputs the sub-circuits to the circuit analysis engine 120.

Figure 11:
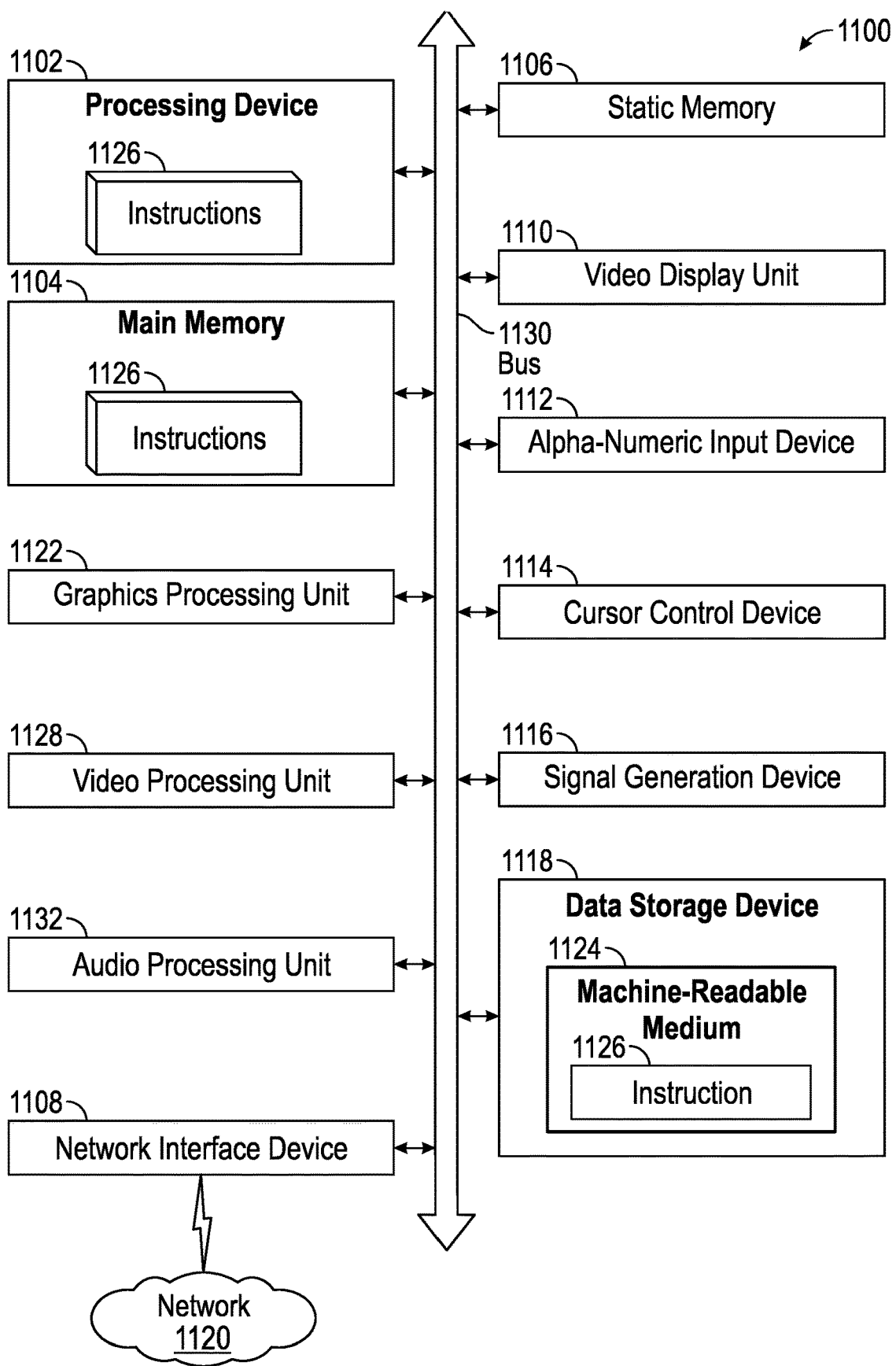
FIG. 11 depicts a diagram of an example computer system in which embodiments of the present disclosure may operate.

The circuit analysis engine 120 includes one or more processors (e.g., a processing device 1102 of FIG. 11) that executes instructions (e.g., instructions 1126 of FIG. XX11 stored within a memory (e.g., main memory 1104 or the machine-readable storage medium 1124 of FIG. 11) to receive a digital design file and process the digital design file to identify one or more sensitive nets. The circuit analysis engine 120 receives the digital design file the memory 130 or a system external to, or connected to, the circuit simulation system 100. In one example, the circuit analysis engine 120 receives the sub-circuits identified by the sub-circuit engine 110 in addition to, or alternatively to, the digital design file.

The circuit analysis engine 120 identifies the sensitive nets based on sub-circuits of the corresponding IC design file. A sensitive net is a net that when observed, two or more faults associated with one or more nets are observable. In one example, the circuit analysis engine 120 receives the sub-circuits from the sub-circuit engine 110 or the memory 130. In another example, the circuit analysis engine 120 identifies sub-circuits from the IC design. The process for identifying the sensitive nets is described in more detail in the following.

The memory 130 is a memory device connected to the sub-circuit engine 110 and the circuit analysis engine 120, and receives data from and communicates data to the sub-circuit engine 110 and the circuit analysis engine 120. In one example, the memory 130 is connected to other elements within the circuit simulation system 100 and/or elements of systems external to the circuit simulation system 100. Further, the memory 130 is a memory device configured similar to the main memory 1104 or the machine-readable storage medium 1124 of FIG. 11.

Figure 2A:
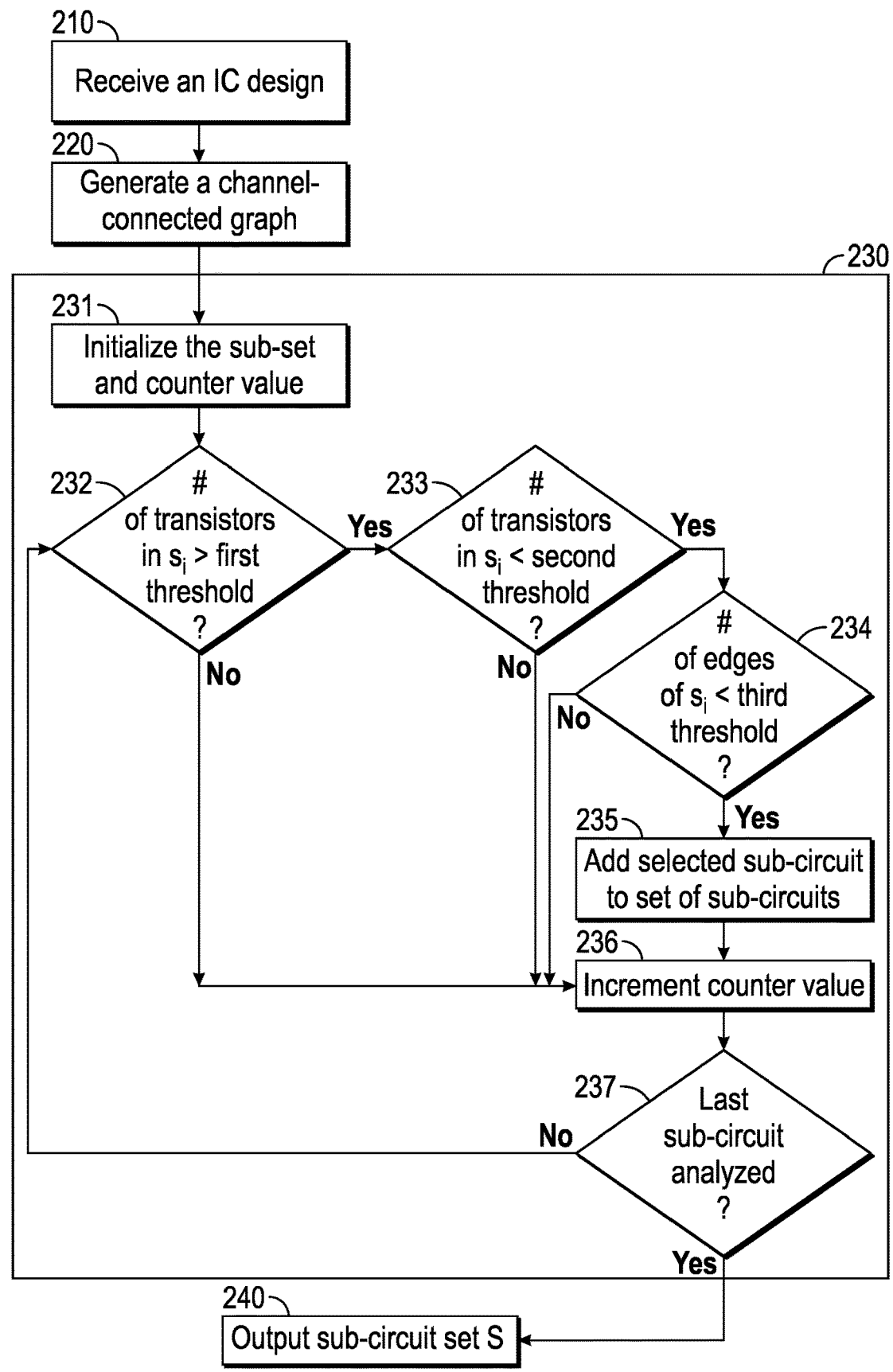
FIG. 2A depicts a flowchart of a method for identifying sub-circuits, according to one or more examples.

FIG. 2A illustrates a method 200 for identifying sub-circuits from the analog circuits of an IC design from a digital design file (e.g., netlist), according to one or more examples. One or more processors of the sub-circuit engine 110 executes instructions stored in a memory to perform the method 200. In one example, the method 200 is performed as synthesis and design for test 1018 of the processes of FIG. 11.

At block 210, a digital design file of an IC design (e.g., DUT) is received. For example, the sub-circuit engine 110 receives the digital design file. Receiving the IC design includes receiving a netlist for the DUT.

At block 220, one or more CCGs are generated from the digital design file. The sub-circuit engine 110 generates the CCG, or CCGs, from the digital design file. In one example, a CCG is generated for each candidate sub-circuit of the IC design corresponding to the digital design file.

Candidate sub-circuits may be received with or as part of the digital design file. In one example, the candidate sub-circuits are received separate from the digital design file. For example, the candidate sub-circuits may be received by the sub-circuit engine 110 from the memory 130. The candidate sub-circuits may be received from a user or an external file and stored within the memory 130. In one example, the candidate sub-circuit are identified by a designer (e.g., user) of the IC design. For example, a circuit design has a hierarchy of sub-circuits. A designer or administrator may provide information as to which sub-circuits may be considered to be independent. The independent sub-circuits are the candidate sub-circuits. In one example, identifiers of the candidate (e.g., independent) sub-circuits are stored within the memory 130 and received by the sub-circuit engine 110. Sub-circuit identifies include names, flags, or tags, among others.

The candidate sub-circuits form the candidate sub-circuit set $\{s_1, s_2, \ldots, s_P\}$. In one example, the sub-circuit engine 110 generates a CCG for each of the candidate sub-circuits. The CCGs are generated at the transistor-level of the IC design for each candidate sub-circuit. As is noted above, the CCG of a sub-circuit is a directed graph where each node is a CCB in the circuit.

Figure 2B:
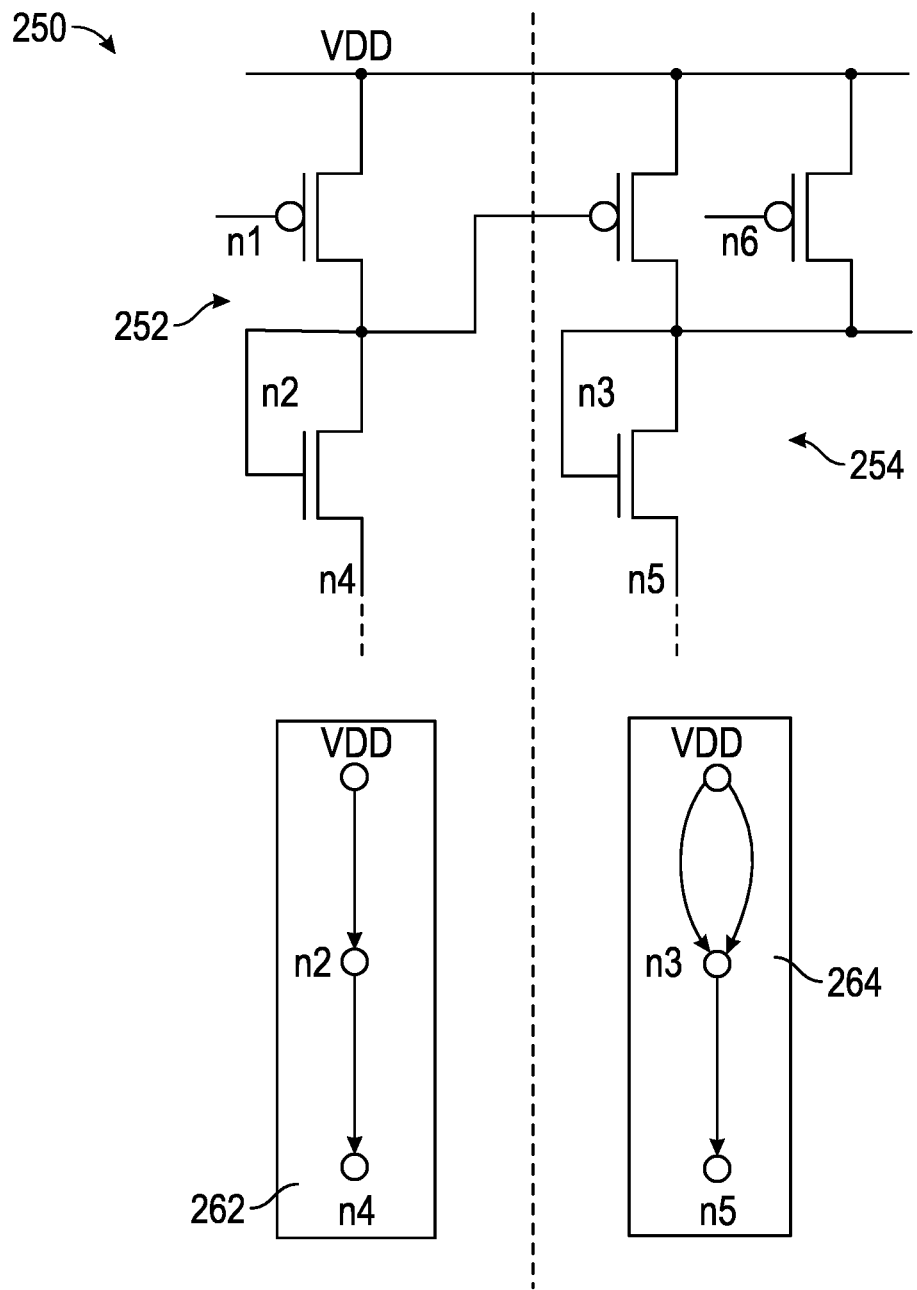
FIG. 2B depicts example channel-connected blocks, according to one or more examples.

FIG. 2B illustrates an example sub-circuit 250 including a first portion 252 and a second portion 254. Further, FIG. 2B illustrates CCBs 262 and 264. The CCB 262 corresponds the first portion 252 of the sub-circuit 250 and the CCB 264 corresponds to the second portion 254 of the sub-circuit 250. The CCB 262 illustrates the connections between the nodes VDD, n2, and n4 of the first portion 252 of the sub-circuit 250. For example, as is illustrated by the CCB 262, the node VDD is connected to the node n2, which is connected to the node n4. The CCB 264 illustrates the connections between the nodes VDD, n3, and n5 of the second portion 254 of the sub-circuit 250. For example, as is illustrated by the CCB 264, the node VDD is connected to the node n3, which is connected to the node n5.

A directed path is placed between the output node n2 of the CCB 262 and the input node n3 CCB 264 to form the corresponding CCG. The directed path corresponds to the direction of current flow from the output node of the CCB 262, e.g., from node n2, to the input node of the CCB 264, e.g., at node n3.

In one example, to determine the CCB 262 and 264, the sub-circuit engine 110 identifies the power supply node for each sub-circuit. For example, with reference to the sub-circuit 250, the sub-circuit engine 110 detects the power supply node VDD. The sub-circuit engine 110 detects each node connected to the power supply node VDD. For example, with reference to the sub-circuit 250, the sub-circuit engine 110 traces each connection of the power supply node VDD to other circuit elements within the sub-circuit 250 to detect the nodes n2 and n3 which are connected to the power supply node. Further, the sub-circuit engine 110 traces each connection to the nodes n2 and n3 to other circuit elements within the sub-circuit 250 to detect the corresponding connected nodes. This process is completed until another power supply node or output node is reached. The connections between CCBs are determined, by tracing the connection paths between the corresponding circuit elements, and directed paths are added to the CCBs to determine the corresponding CCG.

In one or more examples, a circuit may be a metal-oxide-semiconductor field-effect transistor (MOSFET) circuit. In MOSFET circuits, a CCB consists of the nodes in a sub-circuit that are directly reachable from one another by tracing source-drain connections of the MOSFETs, and stopping at external or internal power-supply nodes. Further, in MOSFET circuits, the input to a CCB is the gate of an MOSFET and the power supply nodes. The output of a CCB is the source or drain of a MOSFET in the CCB.

In other circuit designs, CCBs are generated by performing path tracing of all potential low-impedance paths in a circuit with high-impedance ports being candidates for inputs and low impedance ports being candidates of outputs of the CCBs. For example, with reference to the sub-circuit 250, the CCB 262 is generated by performing path tracing from the node VDD to the other nodes of the sub-circuit 250 along the corresponding low-impedance paths.

In one example, a CCG is generated by placing a directed path (e.g., edge) between two CCBs in a circuit corresponding to the input-output relationship between such CCBs. The direction of an edge in the CCG is from the output port of a CCB to the input port of another (or same) CCB. With reference to FIG. 2B, a directed path is determined and placed between nodes n2 of the CCB 262 and the node n3 of the CCB 263. In one example, the CCB 262 and the CCB 263 may be represented as respective nodes within a corresponding CCG. In such an example, the CCB 262 and 263 may be represented as triangles, or other symbols, within the corresponding CCG.

Figure 3:
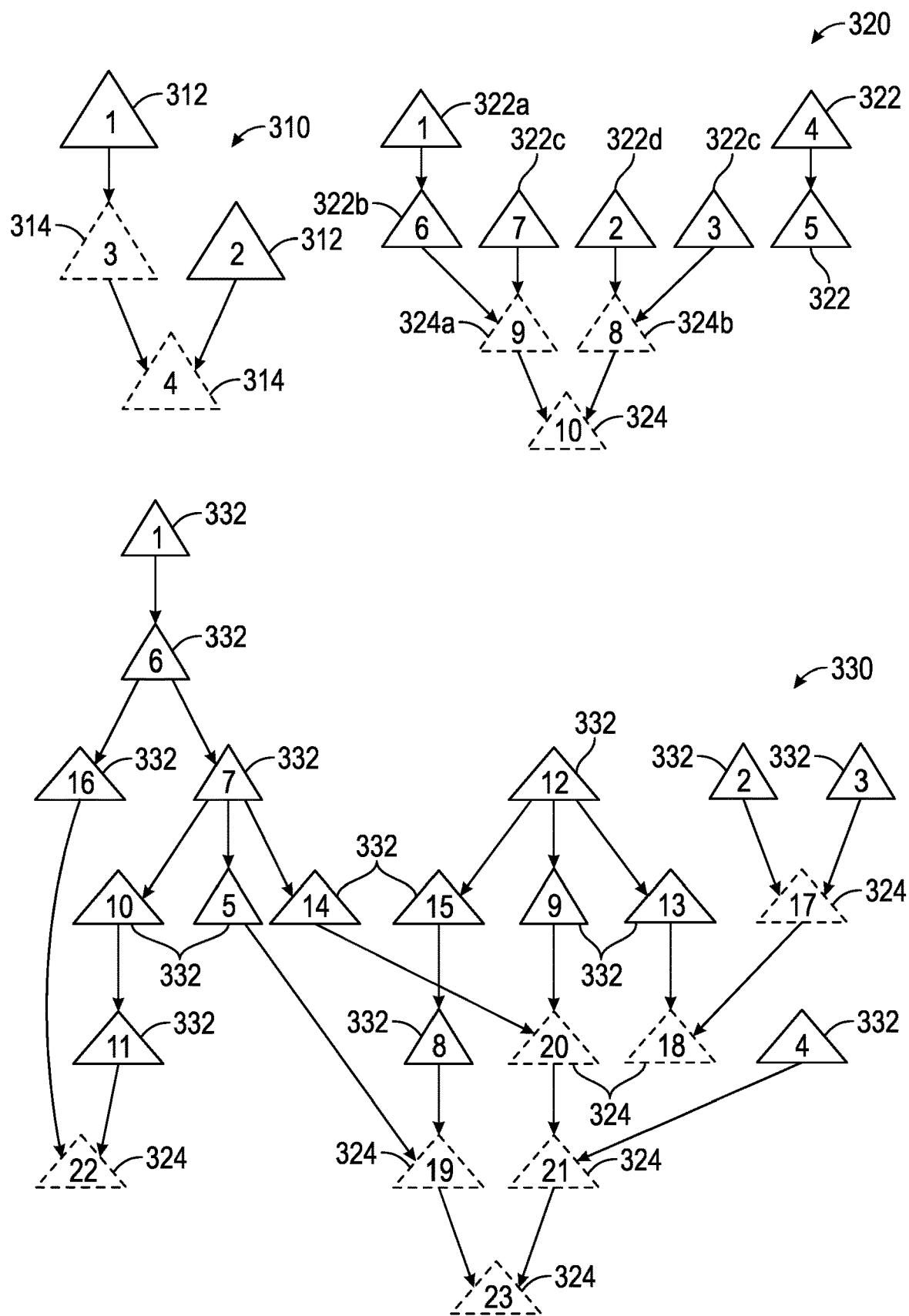
FIG. 3 depicts example, channel-connected graphs, according to one or more examples.

FIG. 3 illustrates example, CCGs 310, 320, and 330. The CCGs 310, 320, and 330 correspond to a respective sub-circuit. Further, the sub-circuits corresponding to the CCGs 310, 320, and 330 differ in size. In one example, the CCG 310 includes nodes 312 and 314. Each of the nodes 312 corresponds to a different CCB. In one or more examples, the nodes 312 represent inverters and the nodes 314 represent NAND gates. The CCG 320 includes nodes 322 and nodes 324. Each of the nodes 322 and 324 corresponds to a different CCB. In one example, the nodes 322 represent inverters and the nodes 324 represent NAND gates. The CCG 330 includes nodes 332 and nodes 334. Each of the nodes 332 and 334 corresponds to a different CCB. In one example, the nodes 332 represent inverters and the nodes 334 represent NAND gates.

Table 400 of FIG. 4 indicates the properties of the circuits 410, 420, and 430 corresponding to the CCGs 310, 320, and 330. The table 400 indicates the dimensions, the identified independent CCGs, and the probe points for the circuit 410, 420, and 430 corresponding to the CCGs 310, 320, and 330. In one example, the algorithm 500 of FIG. 5 is utilized to determine the independent CCGs as described in more detail with regard to the description of FIG. 5. A probe point is a point at which a circuit may be probed such that the functionality of the circuit can be analyzed. One or more signals may be acquired via a probe point, and the one or more signals maybe analyzed to determine the functionality and/or fault coverage of a corresponding circuit. In various examples, a probe point may be referred to as a probe point.

The circuit 420 corresponds to the CCG 320. With reference to the circuit 420, the number of circuit nodes is 10 (e.g., total of nodes 322 and 324), the number of input ports is 3, and the number of output ports is 2. Further, the number of CCBs corresponds to the number of nodes. Accordingly, in the circuit 420, the number of CCBs is 10. The input ports correspond to the inputs to the nodes (CCBs) 1, 2, and 3. The output ports correspond to the output of the nodes (CCBs) 5 and 10. The input and output nodes are determined based on the corresponding IC design. As illustrated in the last two columns of Table 400, three independent CCGs (e.g., sub-graphs) are identified in addition to the probe points. In one example, two such sub-graphs consisting of vertices {324a, 322b, 322c, 322a}, and {324b, 322d, 322c} and vertices 324a and 324b are identified as respective probe points. The probe points are described in further detail with regard to FIG. 6. As will be described in more detail in the following, running transient simulations on the identified vertices, if a fault is injected in the first sub-graph the output of vertex 324a is affected, and vertex 324b or any other probe point vertex is not affected. This holds true for faults in other sub-graphs. Accordingly, for injected faults, one in each sub-graph, the faults are manifested at respective probe points. Instead of three simulations, e.g., one for each node, one simulation is able to cover the three faults. Accordingly, the number of simulations utilized to achieve a predetermined percentage fault coverage may be reduced.

In one example, to generate a CCG (e.g., the CCG 310, the CCG 320, and the CCG 330), the sub-circuit engine 110 identifies CCBs of a sub-circuit. The CCBs correspond to nodes of the CCG. Each CCB includes channel connected circuit elements. The directed graph $G=(V,E)$ represents the CCG obtained from a sub-circuit, where $V=\{v_1, v_2, v_3, \ldots, v_n\}$ is the set of vertices and $E=\{e_1, e_2, e_3, \ldots, e_m\}$ is the set of edges that connect these vertices. The vertices are the CCBs of a CCG. The CCBs are connected via edges of the CCG. An edge is denoted by the corresponding CCBs that are connected by the edge. An edge $e_k$ denotes as a two-tuple, $e_i=\{v_i,v_j\}$ such that $v_i$, $v_j \in V$ and $e_k$ is directed from $v_i$ to $v_j$. In a directed graph $G=(V,E)$, independent Sub-graph $G^I=(V^I,E^I)$ is a graph where $V^I \subset V$, $E^I \subset E$. In the Sub-graph $G^I=(V^I,E^I)$, vertices in $V^I$ do not have any incoming edges from vertices in $V-V^I$. For example, $\forall v_i \in V^I$, $\forall v_j \in V-V^I$, $\nexists e_k \in E$, $e_k=\{v_j, v_i\}$. Further, edge $e_k=\{v_i, v_j\} \in E^I$ iff $v_i$, $v_j \in V^I$.

In one example, to generate a CCG, the sub-circuit engine 110 identifies the independent sub-graphs of a graph $G=(V, E)$. As illustrated by the algorithm 500 of FIG. 5, the CCG $G=(V, E)$, where $V=\{v_1, v_2, v_3 \ldots, v_n\}$ is the set of vertices and $E=\{e_1, e_2, e_3 \ldots, e_m\}$ is the set of nodes. In one example, "n" is equal to, greater than, or less than "m". Further, "n" is four or more and "m" is four or more. The CCG G functions as an input to the sub-circuit engine 110.

The sub-circuit engine 110 processes the CCG G to determine the corresponding independent sub-graphs.

In one example, the sub-circuit engine 110 identifies the vertices in the CCG G which do not have any incoming edges. An incoming edge is an input edge of a CCB of a CCG that is not connected to the output of another CCB of the CCG. In one example, let $\{v_1, v_2, \ldots, v_p\}$ be the vertices, and $V^I=\{V_1^I, V_2^I, \ldots, V_p^I\}$ such that $\forall_{i=1}^{p} V_i^I=\{v_i\}$. Further, for each vertex $V_i^I \in V^I$, the sub-circuit engine 110 adds new vertices by employing a Depth First Traversal from $v_i (\in V_i^I)$. Depth First Traversal is a graph traversal algorithm. In one example, the Depth First Traversal algorithm starts at a root node of a graph and explores as far as possible along each branch of the graph before backtracking. Further, the sub-circuit engine 110 adds a vertex $v$ to $V_i^I$ based on the vertex $v$ having incoming edges from vertices in $V_i^I$. For example, as illustrated by the algorithm 500 of FIG. 5, to add a new vertex is added to $V_i^I$, the vertices $v$ of CCG G are traversed started from $v_i (\in V_i^I)$ While traversing the vertices $v$ of $V_i^I$, if a vertex $v$ is determined to have an incoming edge from another vertex of $V_i^I$, then $V_i^I=V_i^I+\{v\}$.

The process of adding vertices terminates based on the determination that no new vertex is being added to $V_i^I$. Further, for each set of vertices $V_i^I \in V^I$, the corresponding set of edges $E_i^I$ is constructed by setting $E_i^I=\emptyset$ and $\forall e_k=\{v_a, v_b\} \in E$, where $E_i^I=E_i^I+\{e_k\}$ based on $v_a, v_b \in V_i^I$. As illustrated by the algorithm 500 of FIG. 5, for each edge $e_k=\{v_a, v_b\} \in E$, if $v_a \in V_i^I$ and $v_b \in V_i^I$, then $E_i^I=E_i^I+\{e_k\}$.

Based on the identified vertices V and edges E, the sub-circuit engine 110 identifies that the graphs constituted by $(V_1^I, E_1^I)$, $(V_2^I, E_2^I)$, ..., $(V_p^I, E_p^I)$ as the independent sub-graphs present in corresponding GGC. The sub-circuit engine 110 outputs the identified sub-graphs to the memory 130 and/or the circuit analysis engine 120.

As is noted above, FIG. 5 illustrates an example algorithm 500 for determining the independent sub-graphs for a sub-circuit. In other examples, other algorithms may be utilized to determine the independent sub-graphs.

In one or more examples, probe points within a sub-graph may be determined. The probe points may be utilized to detect faults that are present within its corresponding sub-graph, as is described in more detail in the following. Further, within a CCG, the probe point is the vertex having the sub-graph as a cone of influence. For an independent sub-graph $G_i^I=(V_i^I, E_i^I)$ of graph $G=(V,E)$, vertex $v' \in G_i^I$ is a suitable candidate for a probe point of $G_i^I$ iff $\exists e_k=\{v', v_k\}$, $v_k \in G-G_i^I$. A sub-graph can have more than one probe candidate. Out of these, vertex $v$ is chosen as the probe point such that in the directed graph $G_i^I$ there exists a path from all other candidate to vertex $v$.

At block 230, one or more sub-circuits are identified from the generated CCGs for the candidate sub-circuits. For example, the sub-circuit engine 110 identifies the sub-circuits from the CCGs generated at block 220 of FIG. 2. At block 231 the subset of sub-circuits and counter value is initialized. For example, the subset of sub-circuits is initialized to being an empty subset and the counter value "i" is initialized to a value of 1. In one example, the sub-circuit engine 110 initializes the subset to being empty and the corresponding counter value i to 1. The subset may be referred to as subset S and is an empty of identified sub-circuits. Further, the sub-circuit engine 110 selects the first candidate sub-circuit $s_1$ of the candidate sub-circuit set $\{s_1, s_2, \ldots, s_P\}$ based on the counter value 1.

At block 232, the number of transistors of the selected candidate sub-circuit (e.g., sub-circuit $s_i$) is compared to a first threshold. The number of transistors for a sub-circuit is based on the total number of transistors within the corresponding CCB or CCBs of the sub-circuit. In one example, the sub-circuit engine 110 determines the number of transistors for the selected candidate sub-circuit and compares the number of transistors to a first threshold. The number of transistors is determined by counting or summing the number of transistors within each CCB of the sub-circuit. The sub-circuit engine 110 identifies the sub-circuit based on the transistor count of the sub-circuit being greater than a first threshold. The first threshold may be referred to as a minimum transistor threshold. The minimum threshold may be about ten percent of the total transistor count of the corresponding IC design. In other example, the threshold may be greater than or less than ten percent of the total transistor count of the corresponding IC design.

Based on the number of transistors of the selected sub-circuit being greater than the first threshold, the number of transistors is compared to a second threshold at block 233. The sub-circuit engine 110 compares the number of transistors to the second threshold based on the number of transistors of the selected sub-circuit being greater than the first threshold. The second threshold may be referred to as a maximum transistor threshold. In one or more examples, the maximum transistor threshold may be set to about 50 percent of the total transistor count within the IC design. Further, the maximum transistor threshold may be less than or greater than 50 percent of the total transistor count within the IC design. The second threshold is greater than the first threshold. Based on a determination that the number of transistors of the selected sub-circuit is less than the second threshold, the number of edges of the nodes of the selected sub-circuit is compared to a third threshold at block 234. For example, the sub-circuit engine 110 compares the number of edges of the nodes of the selected sub-circuit is compared to the third threshold. The sub-circuit engine 110 determines the number of edges of the nodes from the corresponding CCG of the selected sub-circuit. A sub-circuit corresponds to one or more CCBs of the CCG. The edges of the CCBs (e.g., the counting edges) are summed or counted. The third threshold may be referred to as a max edge threshold. The third threshold may be set such that there is minimum dissimilarity between the responses of the sub-circuits when the sub-circuits are simulated in isolation versus when the sub-circuits are simulated as a part of the complete IC design.

Based on the number of edges of the selected sub-circuit being determined to be less than the third threshold, the selected sub-circuit is added to the set of identified sub-circuits at block 235. For example, the sub-circuit engine 110 adds a selected sub-circuit to the set of identified sub-circuits based on the number of edges of the selected sub-circuit being determined to be less than the third threshold.

At block 236, the counter value i is incremented. For example, the sub-circuit engine 110 increments the counter value i such that the next sub-circuit is selected when the block 230 is repeated to analyze each of the sub-circuits of the set of sub-circuits.

Based on the determination that the number of transistors of the selected sub-circuit is less than the first threshold at block 232, the blocks 233, 234, and 235 are skipped and the counter value i is incremented at the block 236. Based on the determination that the number of transistors of the selected sub-circuit is greater than the second threshold at block 233, the blocks 234, and 235 are skipped and the counter value i is incremented at the block 236. Based on the determination that the number of edges is greater than the third threshold at the block 234, the block 235 is skipped and the counter value i is incremented at the block 236. By skipping block 235, the current sub-circuit under analysis is not added to the set of sub-circuits to be output at block 240.

At block 237, a determination as to whether or not the current selected sub-circuit is the final (e.g., last) sub-circuit of the set is made. For example, the sub-circuit engine 110 compares the counter value i to p, where p is a value indicative of the final sub-circuit in the set of sub-circuits. If i is less than or equal top, the next sub-circuit is selected and processed via blocks 232-234 to determine if the selected sub-circuit is to be added to the set of sub-circuits or not. If i is greater than p, the identified sub-circuit set is output at block 240. For example, the sub-circuit engine 110 provides (e.g., outputs) an indication of the identified sub-circuit set to the memory 130, provides (e.g., communicates) an indication of the identified sub-circuit set to the circuit analysis engine 120, and/or provides an indication of the sub-circuit on a display unit (e.g., the video display unit 1110 of FIG. 11) to be displayed. The indication of the identified sub-circuit set identifies each sub-circuit included within the identified sub-circuit set. For example, the indication may include a name, flag, pointer, or another type of identifier for each sub-circuit within the identified sub-circuit set. The set of sub-circuits may be further analyzed to determine where within the corresponding IC design to place probes. The probes may be analyzed to determine the fault coverage for the sub-circuits of the IC design. In one example, probes may be placed at locations within the sub-circuits that are able to detect one or more faults. One method for identifying where to place the probes is described with regard to FIG. 6. However, in other examples, the probes may be located using other methods.

Figure 6:
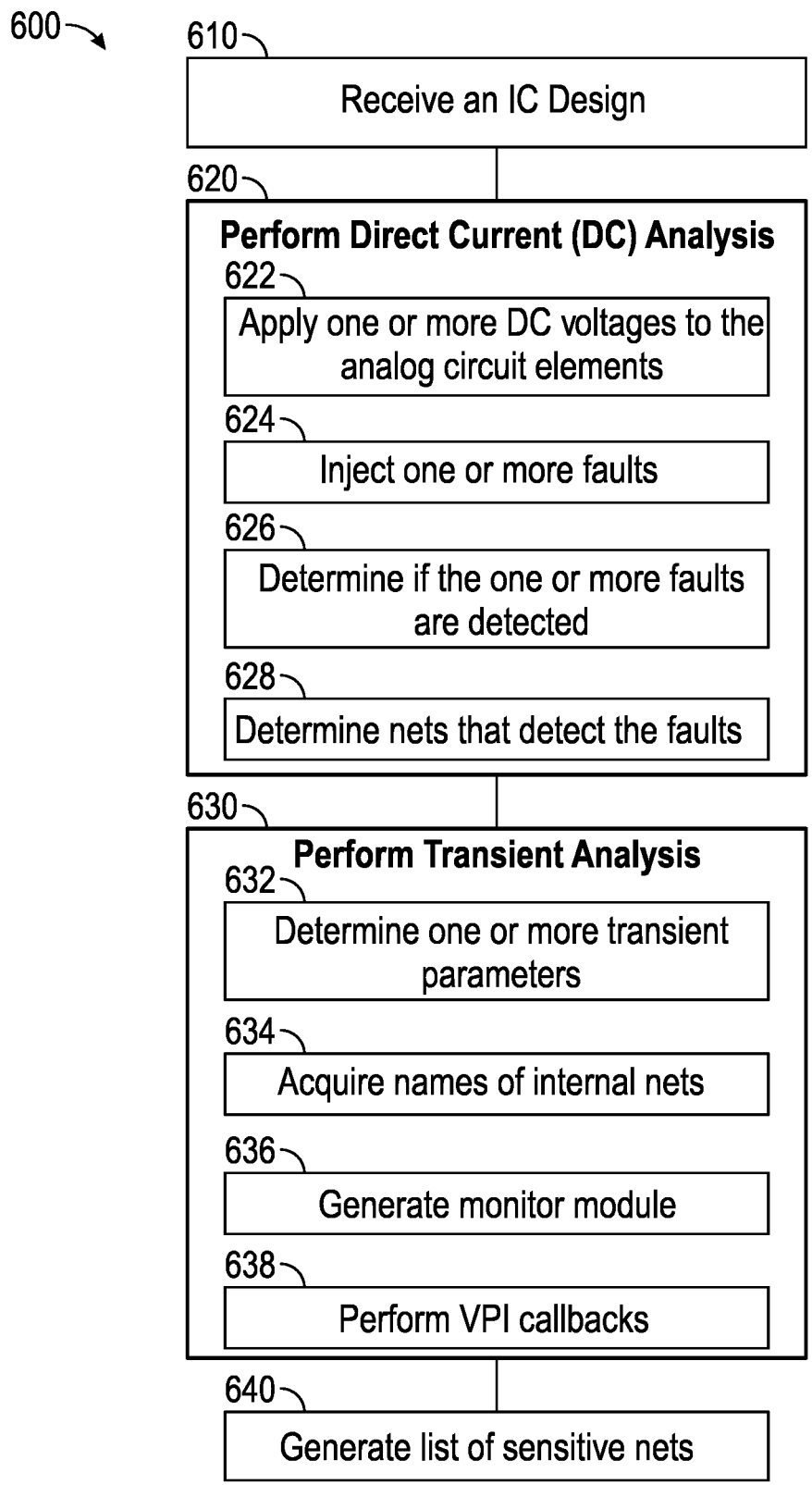
FIG. 6 depicts a flowchart of a method for identifying sensitive nets, according to one or more examples.

FIG. 6 illustrates a method 600 for identifying sensitive nets, according to one or more examples. In one more examples, one or more processors of the circuit analysis engine 120 executes instructions stored in the memory 130 to perform the method 600. In one example, the method 600 is performed as synthesis and design for test 1018 of the processes of FIG. 11.

At block 610 a digital design file of an IC design is received. For example, the circuit analysis engine 120 receives the digital design file. The circuit analysis engine 120 receives the digital design file from the memory 130, another element within the circuit simulation system 100, or a system external to the circuit simulation system 100. The digital design file is a netlist file. In one example, the circuit analysis engine 120 additionally receives the set of sub-circuits determined by the sub-circuit engine 110 from the method 200. The circuit analysis engine 120 receives the set of sub-circuits determined by the sub-circuit engine 110 from the sub-circuit engine 110 and/or the memory 130.

At block 620, DC analysis is performed on the analog circuit portion of the IC design. For example, the circuit analysis engine 120 identifies the analog circuit portion of the IC design from the digital design file and performs DC analysis on the analog circuit portion of the IC design. The circuit analysis engine 120 analyses the analog circuit elements of the IC design at one or more DC voltages to detect faults within the analog circuit elements of the DUT. For example, at block 622, a steady state of the analog circuit elements of the IC design is analyzed at one or more DC voltages. The analog circuit elements of the IC design are analyzed to determine the performance of the analog circuit element as one or more faults are injected (e.g., applied) to the analog circuit elements at block 624. In one example, the set of targeted faults is denoted as F={f_1, f_2, . . . , f_n}. At block 624, one or more faults are injected into the IC design. For example, after biasing the IC design with the one or more DC voltages (e.g., biasing inputs or voltages), DC analyses is completed on the fault-free circuit (e.g., no faults injected into the IC design during test) and for each of the n faults in F injected into the IC design under test. In these analyses, the state of the circuit is a k-tuple including the DC operating point voltages of the k nets present in N. Further, $S\_(f\_i)=\langle v\_1, v\_2, \ldots, v\_k \rangle$ denotes the state of the circuit under fault f_i, and $\forall j \in [1, \ldots k]$, and v_j is the DC operating point voltage of the net $n\_j \in N$. S_0 denotes the state of the fault-free circuit.

At block 626, a determination as to whether or not a fault is detected is made. A fault is detected based on a determination that the DC operating point value when a fault is injected deviates from the fault-free DC operating point value. In one example, the deviation of the operation of the IC design is compared to a threshold value. Based on the deviation exceeding the threshold value, the current fault is determined to be detected (or covered). In one example, a detected fault is a fault that is determined to be covered by a net. Further, a fault $f_i$ is covered by a net $n_j$ if there is a deviation of the DC operating point voltage value of $n_j$ under the $f_i$ fault condition from its fault-free DC operating point value, and if the deviation is above a threshold value. The threshold value may be a combination of a relative and absolute value. The relative value may be related to the fault-free voltage value. For example, the threshold may be in a range of about −10% to about +10% of a fault free voltage value. Further, the threshold value may be −100 mV to about +100 mV of a fault free voltage value. In one example, the fault free DC value of a node is 2 V and the threshold range is in a range of about 1.8 V to about 2.2 V. A value of less than 1.8 V or greater than 2.2 V is considered a faulty value. In other embodiments, other threshold ranges may be utilized.

At block 628, the faults detected by the nets of the IC design are determined. For example, the values of the n faulty states of the system (each a k-tuple) are compared with the fault-free analysis (e.g., operation) to determine the faults that are detected by each net. Initially, the nets present in $N_A$ are considered as these nets are accessible as output ports. The faults that are detectable by these nets are discarded from the fault list F, and added to the list of covered faults, denoted by $F_{covered}$. The nets present in $N-N_A$ are added to the set $N_s$ one by one. For example, the nets are added to the set $N_s$ using a greedy algorithm (or similar algorithm) for set covering. A greedy algorithm identifies which of the nets are sensitive nets. For example, a net that detects the largest number of faults within the set of nets is selected before other nets of the set. In other examples, parameters (e.g., heuristics) other than the number of faults are used to identify a net to be selected and added to the set of sensitive nets. In one example, the depth of the module corresponding to the location of the net, and/or the area overhead in probing the net may be used in addition, or alternatively, to the number of faults detectable by each net in selecting the sensitive net or nets.

In one example, the greedy algorithm includes: selecting net $n \in N-N_s$, such that n detects a maximum number of faults, $\sigma_n$, in F; adding $\langle n, \sigma_n \rangle$ to $N_s$; and removing n from N. In one example, the net combination that results in maximizing the number of detected faults is determined. Further, the greedy algorithm includes removing all the faults in F which are detected by n and adding these faults to the set $F_{covered}$. The above steps are repeated to add nets to the set $N_s$ of sensitive nets. In one or more examples, the choice of the next net depends on the corresponding effectiveness to increase the fault coverage. In other examples, other algorithms may be used to generate the set of sensitive nets.

At block 630, transient analysis is performed on the IC design. For example, the circuit analysis engine 120 performs transient analysis on the IC design. Performing transient analysis increases the fault coverage by subjecting the faults not covered by DC analysis at block 620 to transient analyses. In an example, transient analysis may be completed based on a determination that the DC analysis process covers less than "M" percentage of the faults. In such an example, "M" is less than or equal to about 99. Transient analysis determines a response of the analog circuit portion of an IC design over a period of time. Performing transient analysis includes a simulation trace parameter, a range of a signal, steady state value(s) of a signal, a range of instantaneous frequency of a signal, and a derivative with respect to time (DDT) range of a signal. DDT is a time derivative (dV/dt) associated with a change of voltage of a signal.

A simulation trace $\tau$ is a mapping $\tau: \mathbb{R}_{\geq 0} \rightarrow \mathbb{R}^{|X|}$, where $X=\{x_1, x_2, \ldots, x_n\}$ is a set of real variables representing the signals present in the system. The value of $x \in X$, at a time point t in the trace $\tau$ is given as $\tau_x(t)$. In one example, each node of a circuit has a corresponding time-varying signal representing a corresponding transient (e.g., time-dependent) behavior. Each time-varying signal corresponds to a simulation trace.

A range of values of a signal $x \in X$ during a simulation trace $\tau$ is the maximum and minimum values attained by the signal in the entire simulation trace. The range of values of the signal is denoted by $\mathcal{R}_\tau(x)$, i.e., $\mathcal{R}_\tau(x)=[p:q]$ represents that $\forall t \in \text{domain}(t)$ $p \leq \tau_x(t) \leq q$. Also, $l(\mathcal{R}_\tau(x))=p$ and $r(\mathcal{R}_\tau(x))=q$ denotes the minimum and maximum values, respectively. In one example, a range of values of the signal correspond to values that a signal can take over time and include a maximum and minimum value.

The steady state levels of the signal $x \in X$ is given by a set of real values, $\mathcal{S}_\tau(x)=\{s_1, s_2, \ldots, s_n\}$, at which the signal has settled for a given amount of time during the simulation trace $\tau$. A steady state level is a value of a signal when the signal has a constant value for a given amount of time.

For a given real value v and a signal x, instantaneous frequency range of signal x about the value v measures the maximum and minimum instantaneous frequency of oscillation of x about v. Further, $\mathcal{F}_{\tau,v}(x)=[f_{min}:f_{max}]$ denotes that in the simulation trace $\tau$ the minimum ($l(\mathcal{F}_{\tau,v}(x))$) and maximum ($r(\mathcal{F}_{\tau,v}(x))$) frequencies of oscillation of x about v are $f_{min}$ and $f_{max}$ respectively.

If, in the simulation trace $\tau$, there does not exist any oscillation of x about v then both the values are reported as 0. The value v may correspond to an oscillating signal's average voltage.

The maximum and minimum slope experienced by the signal $x \in X$ throughout the simulation trace $\tau$ is given as the DDT Range of the signal. The DDT range of the signal is denoted as $m_\tau(x)=[a:b]$, where a and b are the minimum and maximum slope, respectively, of a signal x in simulation trace $\tau$. Further, the minimum value "a" and maximum value "b" are denoted by $l(m_\tau(x))=a$ and $r(m_\tau(x))=b$.

The signal range, steady state values, instantaneous frequency range, and/or DDT range are monitored and acquired for one or more of the internal nets of the analog circuit while performing transient analysis (e.g., transient simulation).

At block 634, the names of the internal nets are acquired. For example, the circuit analysis engine 120 acquires (e.g., receives) the names from the memory 130. Additionally, or alternatively, the names may be acquired from another element within the circuit simulation system 100 and/or a system or element external to the circuit simulation system 100. The names of the internal nets of the netlist of the IC design (e.g., DUT) are used while performing transient analysis.

At block 636, a monitor module is generated. In one example, the circuit analysis engine 120 generates the monitor module. The monitor module analyzes, monitors, values of a signal within a circuit. The monitor module analyzes the values of a signal in a circuit to determine whether or not a defect is present within the circuit. In one example, the monitor module is a Verilog Analog/Mixed Signal language module generated in response to generating the monitor code and accesses the values of the internal net signals of the DUT. FIG. 7 illustrates an example monitor module 700 for monitoring a signal. A monitor module 700 is generated for each signal to be monitored. The circuit analysis engine 120 utilizes the monitor module 700 to analyze a signal to determine if the value of the signal exceeds a corresponding range of values. In the example of FIG. 7, the circuit analysis engine 120 utilizes the monitor module 700 to monitor the net I1.net1. If a signal at the net I1.net1 (e.g., signal V(I1.net1)) exceeds an upper or lower threshold of a corresponding range virtual path identifier (VPI) callback functions are used to report when the signal exceeds the upper or lower thresholds. The circuit analysis engine 120 uses the VPI callback functions at block 638. The VPI callbacks are supported by Analog/Mixed Signal language simulators. In one example, performing the transient simulation includes, while the transient simulation is running, utilizing the VPI callbacks to output the values of the nets to a memory 130 or system. In one example transferring values of the nets to the other function maintains the ranges, steady state values, instantaneous frequency range, and DDT ranges of signals of all the internal nets. Further, transferring the values of the nets stores the values of the nets within the memory 130.

As is noted above, at block 630, transient analysis of the fault free circuits and the faulty circuits which were not covered during DC analysis is performed, and the values of the signal range, steady state levels, instantaneous frequency range, and/or DDT range for each internal net for each simulation is obtained as an output. Faults that are not covered during DC analysis may be due to a variety of reasons. For example, a fault that manifests only with time-varying signal or if the DC state of all the nodes in the circuit is 0 V (e.g. in a power-up simulation) is not covered by DC analysis.

In one or more examples, the signal range of a signal from net n when the DUT is subjected to a fault $f_i$ is represented by $\mathcal{R}_\tau^{f_i}(n)$, the steady state levels of the signal are represented by $\mathcal{S}_\tau^{f_i}(n)$, the instantaneous frequency range of the signal is represented by $\mathcal{F}_{\tau,v}^{f_i}(n)$, and the DDT ranges of the signal are represented by $m_\tau^{f_i}(n)$. Further, $\mathcal{R}_\tau^0(n)$, $\mathcal{S}_\tau^0(n)$, $\mathcal{F}_{\tau,v}^0(x)$ and $m_\tau^0(n)$ denote the respective values of a net n in the fault-free DUT. A fault $f_i$ is detected by net n based on any one of the following holding true.

$l(\mathcal{R}_\tau^{f_i}(n)) \notin [l(\mathcal{R}_\tau^0(n)) - \mathcal{R}_{tol} : l(\mathcal{R}_\tau^0(n)) + \mathcal{R}_{tol}]$, or
$r(\mathcal{R}_\tau^{f_i}(n)) \notin [r(\mathcal{R}_\tau^0(n)) - \mathcal{R}_{tol} : r(\mathcal{R}_\tau^0(n)) + \mathcal{R}_{tol}]$ $\mathcal{S}_\tau^{f_i}(n)$ and $\mathcal{S}(n)$ are not empty, $\exists s_i \in \mathcal{S}_\tau^{f_i}(n)$ such that
$\forall s_j \in \mathcal{S}(n), s_i \notin [s_j - \mathcal{S}_{tol} : s_j + \mathcal{S}_{tol}]$ $l(\mathcal{F}_{\tau,v}^{f_i}(n)) \notin [l(\mathcal{F}_{\tau,v}^0(n)) - \mathcal{F}_{tol} : l(\mathcal{F}_{\tau,v}^{f_i}(n)) + \mathcal{F}_{tol}]$, or
$r(\mathcal{F}_{\tau,v}^{f_i}(n)) \notin [r(\mathcal{F}_{\tau,v}^0(n)) - \mathcal{F}_{tol} : r(\mathcal{F}_{\tau,v}^0(n)) + \mathcal{F}_{tol}]$ $l(m_\tau^{f_i}(n)) \notin [l(m_\tau^0(n)) - m_{tol} : l(m_\tau^0(n)) + m_{tol}]$, or $r(m_\tau^{f_i}(n)) \notin [r(m_\tau^0(n)) - m_{tol} : r(m_\tau^0(n)) + m_{tol}]$.

In the above, one or more of the variables $\mathcal{R}_{tol}, \mathcal{S}_{tol}, \mathcal{F}_{tol}$, and $m_{tol}$ are thresholds defined via modelling and/or using heuristics (or determined in some other way), for the signal range, steady state values, instantaneous frequency range and DDT range, respectively. In one example, one or more of the thresholds may be user defined. Further, one or more of the thresholds can be set according to the measuring capabilities of the hardware instruments utilized to probe the sensitive nets during post silicon testing. Based on determining which nets can detect which faults, the set $N_s$ is populated at block 640. Block 640 is described in more detail in the following. The set $N_s$ may also include one or more nets added based on performing DC analysis at block 620. Accordingly, the corresponding value of $\sigma_n$ is updated by adding the value of number of faults detected during transient analysis.

In various examples, performing DC analysis before transient analysis reduces the set of uncovered faults that are analyzed by transient analysis. Accordingly, the analysis time of the corresponding IC circuit is reduced.

Various methods may be used to compute the values of the four above-mentioned attributes. These could be classified into online (during simulation) and offline (post-processing) methods. The offline determination includes computing the values of signal range, steady state levels, instantaneous frequency range, and/or DDT range after the transient simulation has completed. The waveform of all the nets is utilized to compute the signal range, steady state levels, and the DDT range of the signals.

In an example, VPI callbacks are triggered to sample the waveforms and to perform high-accuracy calculations. In another example, dynamic waveform checking utilizing analog waveform comparison capabilities can be used. Further, in addition to the above listed online and offline methods, other, online and/or offline methods may be utilized.

At block 640, a set of sensitive internal nets along with a corresponding number of detectable faults are output. For example, the circuit analysis engine 120 outputs the list of sensitive nets to the memory 130. In another example, the circuit analysis engine 120 outputs the list of sensitive nets to a display (e.g., the video display unit 1110 of FIG. 11). In one example, the set of sensitive internal nets is utilized to determine which and how many ports to make accessible for testing of the IC device.

The above procedure for identifying sensitive nets is efficient in finding the sensitive nets which are able to detect a fault even if the fault does not propagate to one of the outputs of the analog circuit. The sensitive nets may be made accessible from the outside of the IC circuit as an output port or from the built-in test structure. Accordingly, the sensitive nets are utilized to increase the fault coverage of the circuit. For example, probe ports may be inserted at one or more of the sensitive nets. However, making an internal net accessible at the output or from the test structure may increase the area overhead of the IC design. A net deep inside the circuit hierarchy may have relatively large area overhead, whereas, an internal net at a higher hierarchy may have very little area overhead.

In one or more examples, one or more internal nets are selected as probe points, one or more regions corresponding to each probe point is identified such that a fault in one of these regions is detected at the corresponding probe point and does not affect the output of another probe point. Multiple faults may be injected in each of these regions during at least partially overlapping periods and the corresponding probe points are monitored for deviations. Accordingly, the amount of time spent on the fault simulation process can be reduced.

In one or more examples, the sub-circuits identified by the method 200 of FIG. 2 are utilized to identify the fault sensitive nets as described with regard to the method 600 of FIG. 6. For example, the input to the method 600 is the set of sub-circuits generated by the method 200. In such an example, the DC analysis at block 620 and transient analysis at block 630 are performed on the sub-circuits generated by the method 200. Further, the sub-circuit engine 110 receives a digital design file (e.g., a netlist file) of an IC design and identifies one or more sub-circuits based blocks 210-240 of the method 200 of FIG. 2. The circuit analysis engine 120 receives the one or more sub-circuits from the memory 130 or the sub-circuit engine 110 and generates a set of sensitive nets from the sub-circuits. In another example, identifying sensitive netlists and identifying sub-circuits occur during non-overlapping periods.

In one example, the sensitive internal nets identified depend on the chosen fault set. A different fault set may result in a different ranking the internal nets. The different fault set or sets may be provided by a user. In one example, as the number of nets probed increases, the percentage of fault coverage increases.

FIG. 8 illustrates a table 800 of circuit properties. Table 800 illustrates circuit properties that include example sensitive nets, DC analysis, and transient analysis results. For example, for the PLL1 circuit, when performing DC analysis, 68 of a total of 98 short circuit faults of 1 ohm injected one by one across the terminals of the transistors showed a deviation of more than 50 mV at the output port. Further, 10 more faults showed deviation at an internal net and were detected. Accordingly, the total number of faults detected with DC analysis is 78. When transient analysis is performed, 8 faults where detected by comparing the values of the oscillation frequency range of the output port clkout about the value 1.6, 6 faults showed discrepancies in the range of VCOin from its fault free range values. Thus, by probing an extra internal net, e.g., VCOin, 16 additional faults are detected, increasing the fault coverage from 77 percent to around 94 percent. In one or more examples, the net VCOin is identified as the most sensitive internal port. In one or more examples, the most sensitive port is the net which deviates from fault-free (normal) behavior for most number of faults. In one example, the VCOin is identified as the most sensitive net based on determining that number of faults detected, identified, at the net VCOin is greater than the number of faults detected at other nets.

Figure 9A:
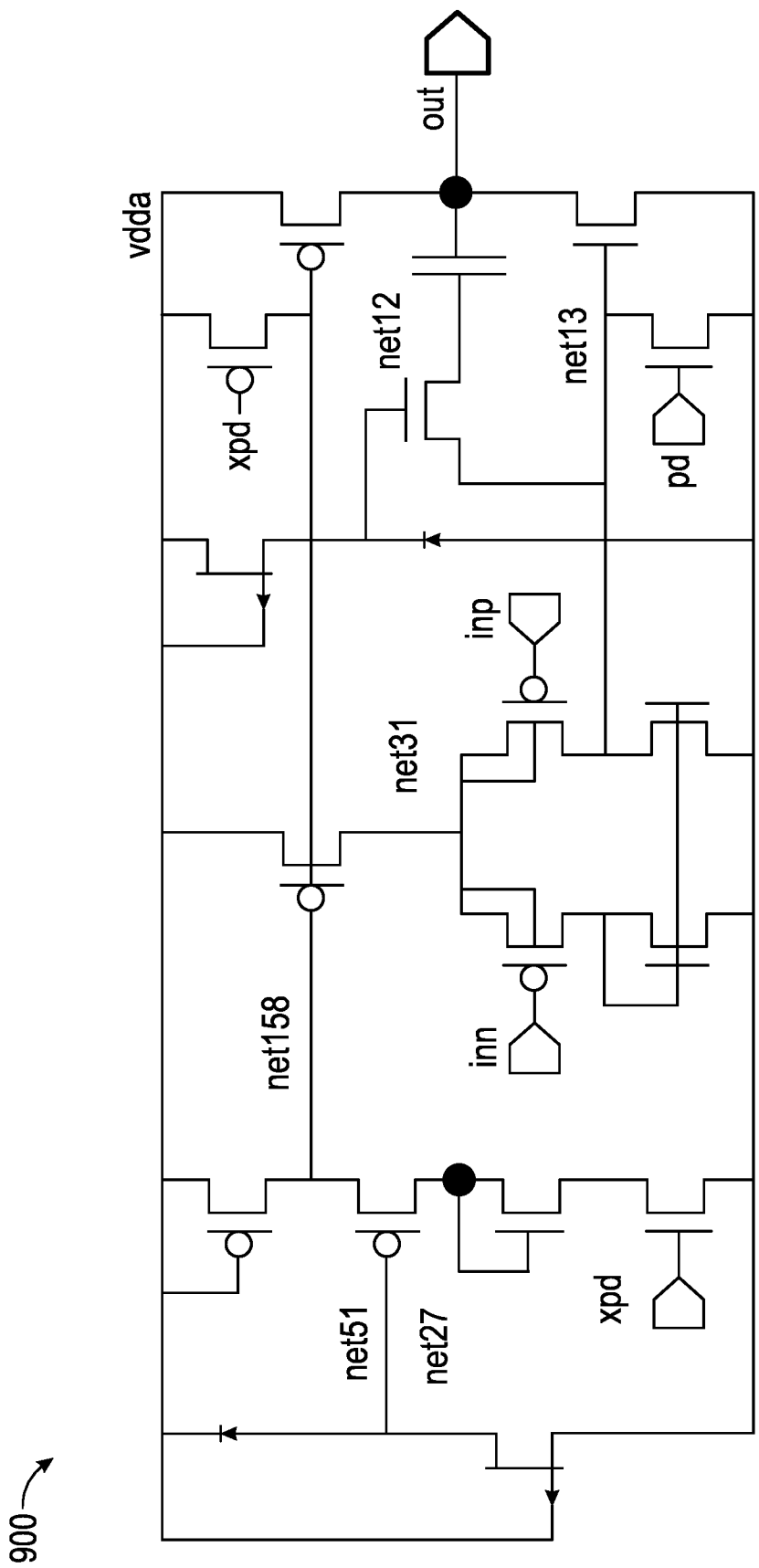
FIGS. 9A, 9B, 9C, 9D, and 9E depict example circuits and sensitive nets, according to one or more examples.
Figure 9B:
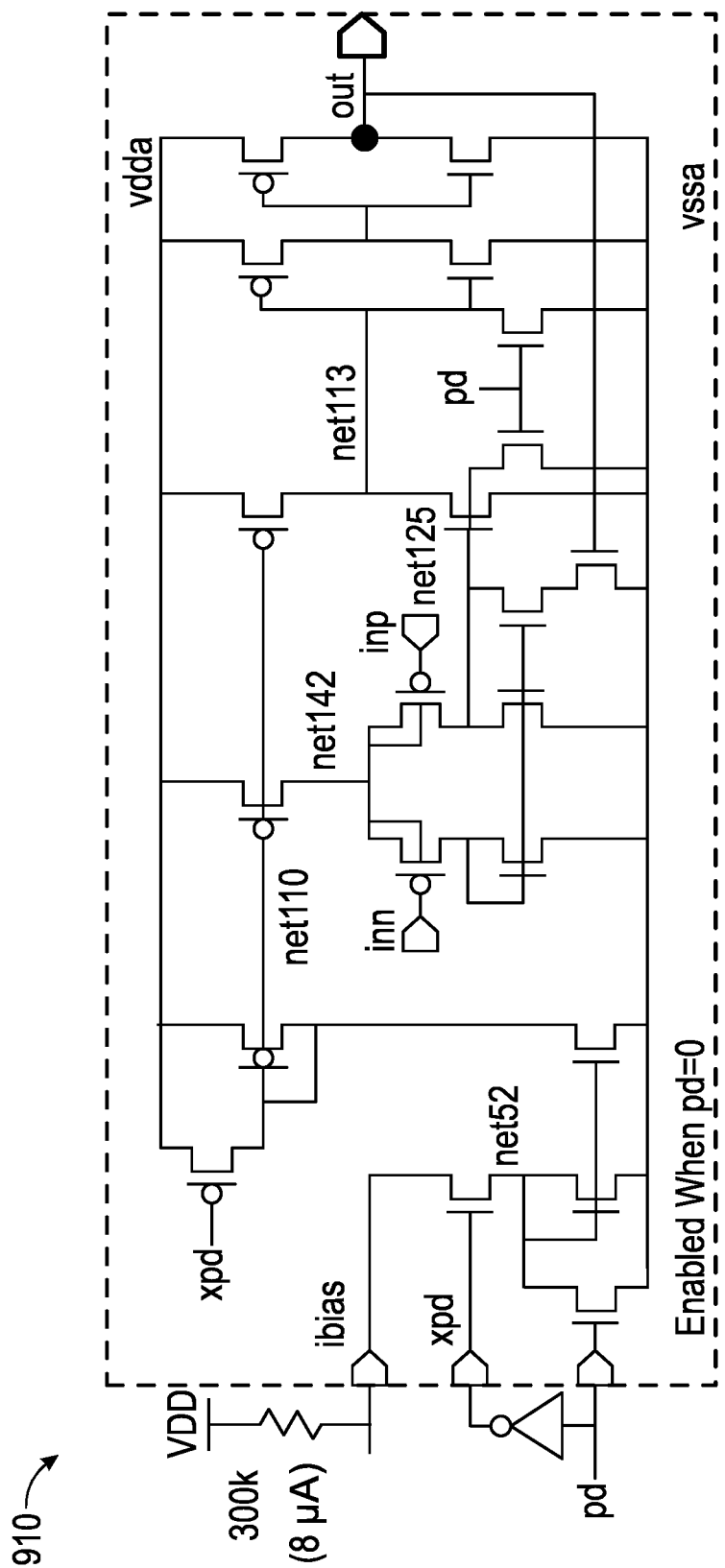
Figure 9C:
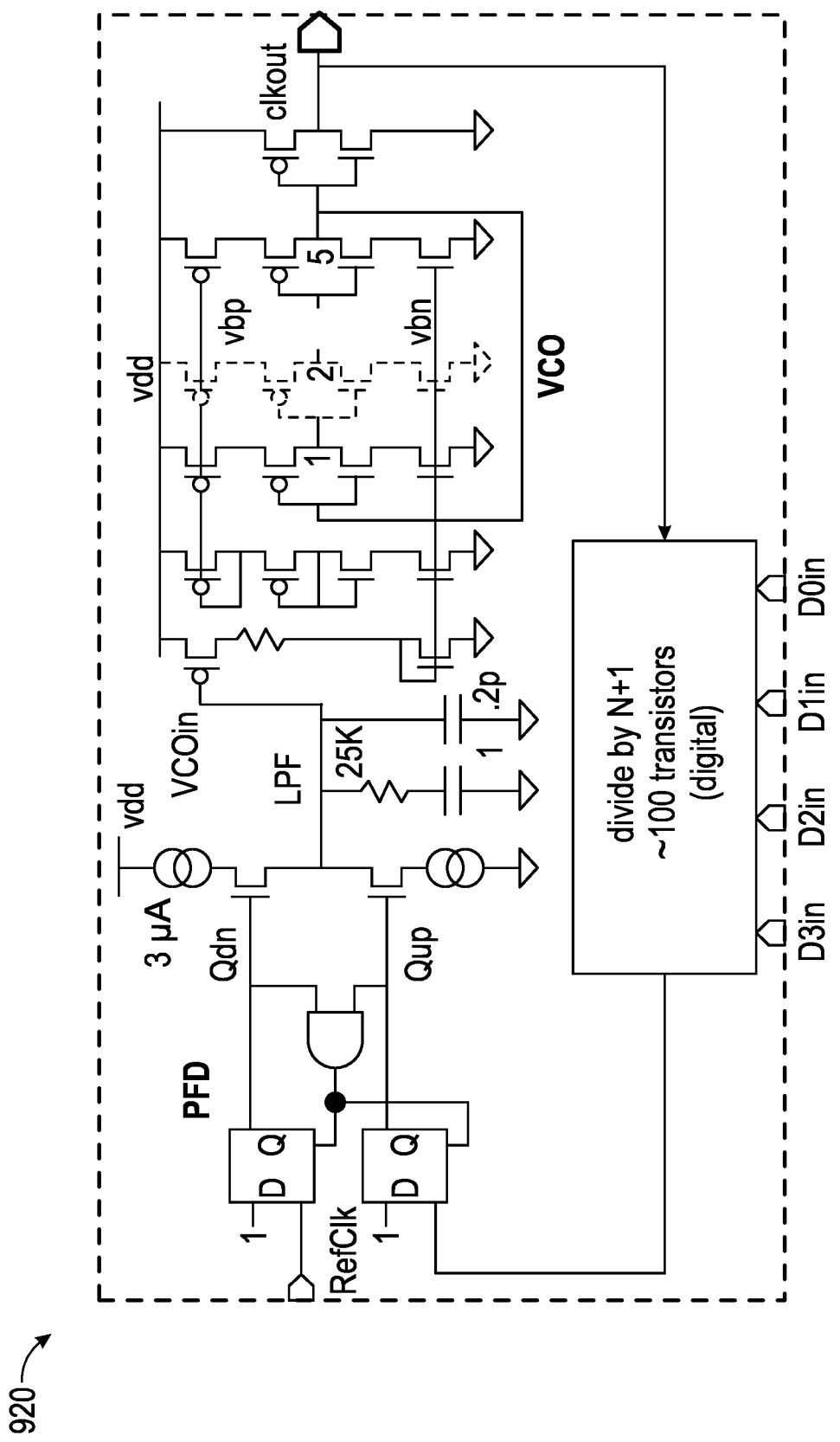
Figure 9D:
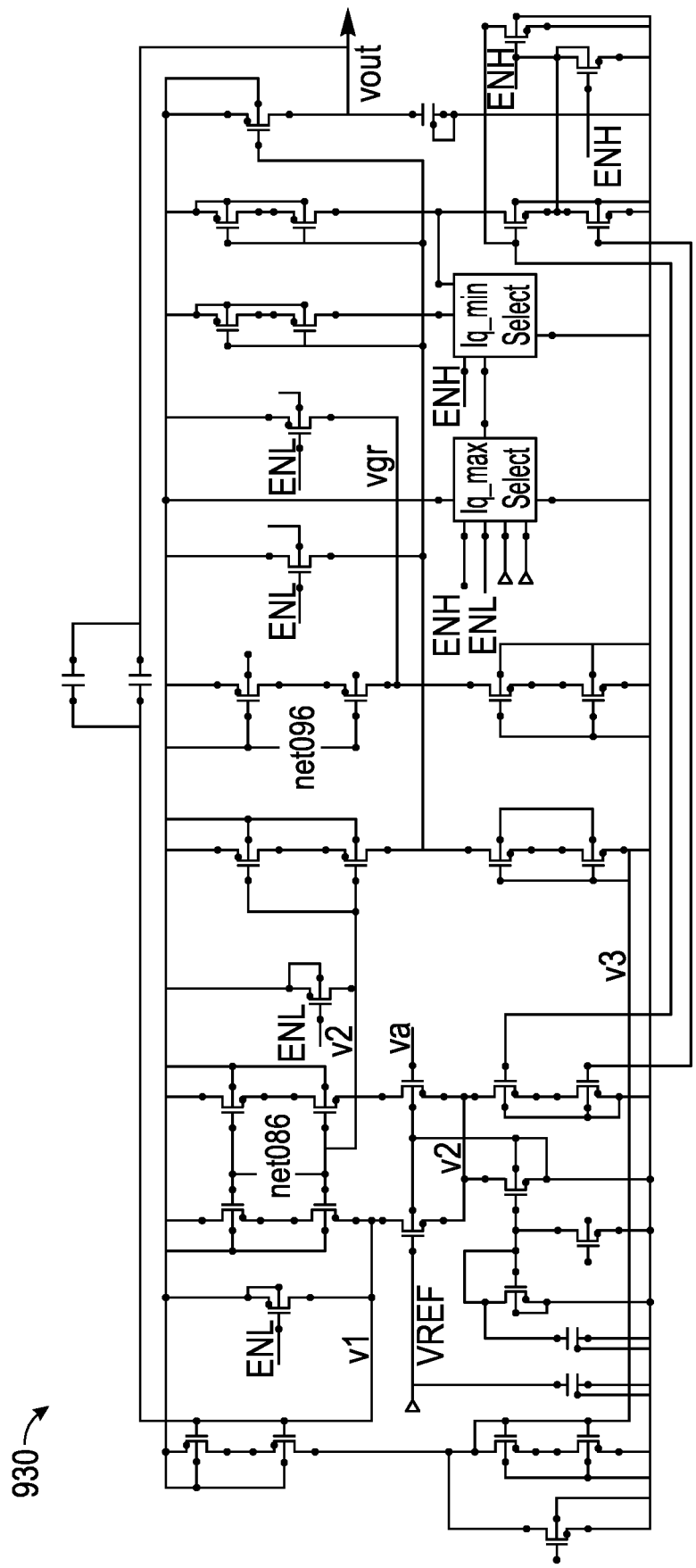
Figure 9E:
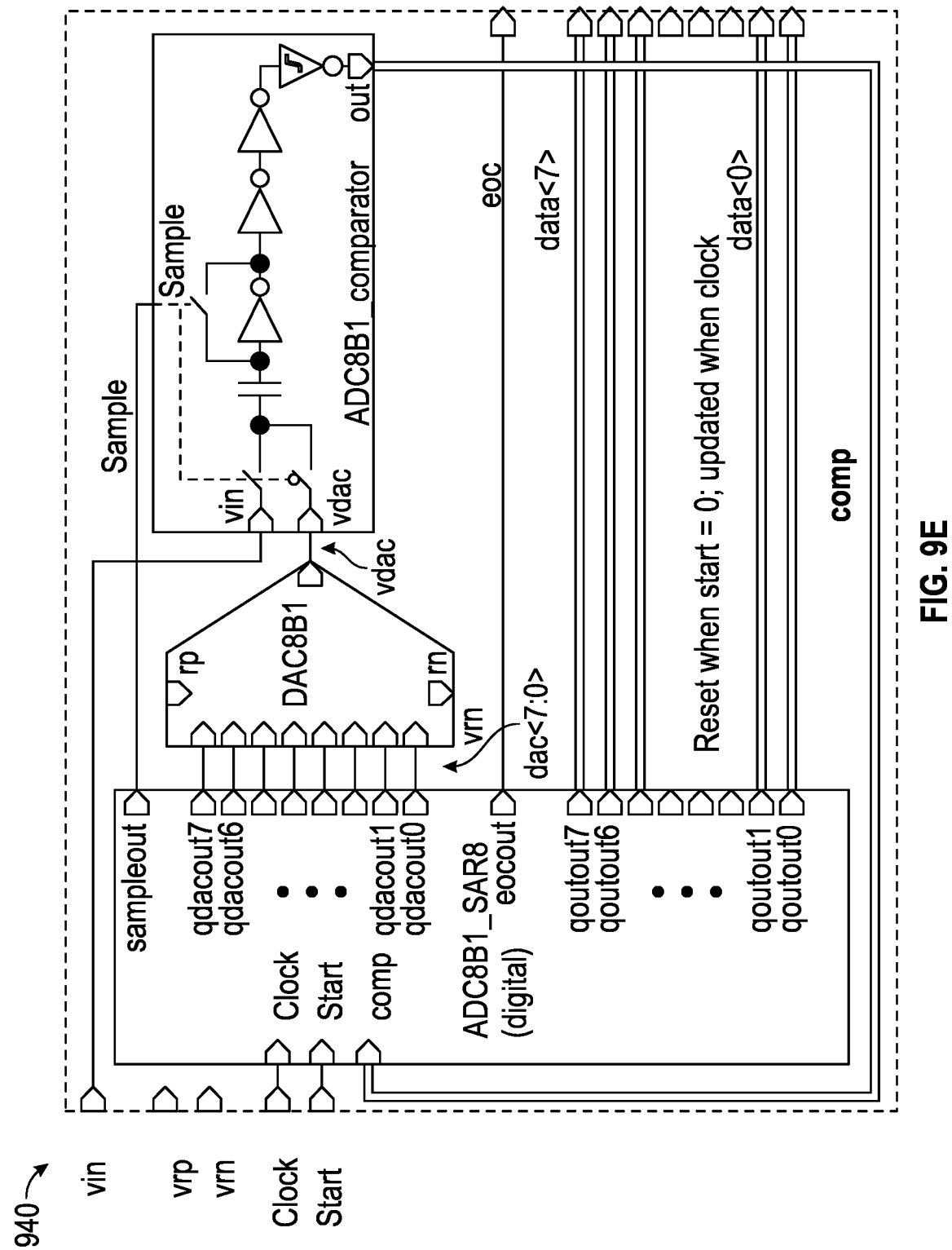

With reference to the OPAMP1 circuit, as can be seen from the table 800, the faults were detected in the DC analysis. Apart from the faults that showed deviation at the output port, 9 faults showed deviation at net27, and 3 more faults showed deviation at net12. The sensitive nets of different circuits (e.g., OPAMP1, COMP1, and PLL1) are shown in FIGS. 9A, 9B, and 9C. For example, IC design 900 of FIG. 9A corresponds to the circuit OPAMP1. In the IC design 900 of FIG. 9A, the nets net27, net12, and "out" are identified as sensitive nets (e.g., nodes). The IC design 910 is illustrated in FIG. 9B. The IC design 910 corresponds to a circuit COMP1. In the IC design 910, the nets net125 and "out" are identified as sensitive nets (e.g., nodes). FIG. 9C illustrates IC design 920. The IC design 920 corresponds to a circuit PLL1. In the IC design 920, the nets VCOin and clkout are identified as sensitive nets (e.g., nodes). FIG. 9D illustrates IC design 930. The IC design 930 corresponds to a circuit LDO. In the IC design 930, the nets net086, net096, and vout are identified as sensitive nets (e.g., nodes). FIG. 9E illustrates IC design 940. The IC design 940 corresponds to a circuit ADC8B1. In the IC design 940, the nets comp, data<0>, and data<7> are identified as sensitive nets (e.g., nodes).

In one example, in analyzing the circuits ADC8B1 and DAC8B1, sub-circuits are identified before sensitive nets are identified. The sub-circuits are identified based on the method 200 of FIG. 2A. The CCG, or CCGs, of the IC circuit design are utilized to confirm that these sub-circuits are able to be simulated in isolation. For example, the CCG may be utilized to visually determine the independence of the sub-circuits.

In one example, the fault universe includes 1 ohm short circuit faults between the terminals of a transistor. For a total of 257 such faults, generated randomly, for each sub-circuit, sensitive nets may be identified by the method 600 of FIG. 6. In one example, identifying sensitive netlists occurs at least partially in parallel with identifying the sub-circuits, increasing the overall time efficiency.

In one example, an IC design (e.g., a DUT) of an LDO circuit consisting of 67 transistors. An example LDO circuit (e.g., IC design 930) is shown in FIG. 9D. To identify the faults within the IC design 930, 68 short circuit faults of 1 ohm are injected one by one into the transistor terminals of the design. DC and transient analysis are performed as indicated in 620 and 630 of the method 600 on the fault-free circuit and the 68 faulty circuits to identify the sensitive nets. In response to DC analysis, 23 of the faults were detected at the output of the IC design 930. Further, the circuit analysis engine 120 determines that the nets net096 and net086 detect 32 faults. The circuit analysis engine 120 identifies the nets as the sensitive nets. In one example, net096 is ranked higher than the other nets as the net is able to detect a total of 28 faults, which is greater than the faults that each of the other nets are able to detect. In one example, net096 is identified as one of the sensitive internal nets and is the drain of one of the biasing transistors responsible for supplying power to the LDO circuit (e.g., the IC design 930).

In one example, an IC circuit design consists of 1560 transistors. In such an example, four independent sub-graphs are identified. Each vertex in the corresponding CCG is a channel connected block consisting of more than one transistor. The number of transistors corresponds to the size of each sub-graph. In one example, the 4 independent sub-graphs include a total of 1247 transistors. If only catastrophic fault consisting of short and open faults between the terminals of a transistor are utilized, for each transistor, 3 faults are considered. Accordingly, the size of the fault set for 1247 transistors is 3741. If each fault is simulated individually 3741 simulations are utilized. However, by simulating multiple faults at a time, the same fault coverage is achieved in 2946 simulations, saving 795 transient simulations. In one example, a set of faults is selected such that no two faults belong to the same independent sub-circuit previously identified. The set of faults may be simulated simultaneously.

In one or more examples, the accuracy of identification of the fault sensitive nets in an analog circuit is improved as compared to previous methods. By finding the independent sub-graphs and the corresponding probe points, the efficiency of testing analog components is improved. The independent sub-graphs are used to determine nodes within the corresponding IC design that may be probed to detect faults within the IC design. The sub-circuits corresponding the sub-graphs are used to identify the sensitive nets within the IC design and to identify where in the IC design probes may be placed to detect faults within the circuit. Accordingly, the fault coverage of the IC design is increased, increasing the manufacturing yield and decreasing the manufacturing costs of the IC design.

Figure 10:
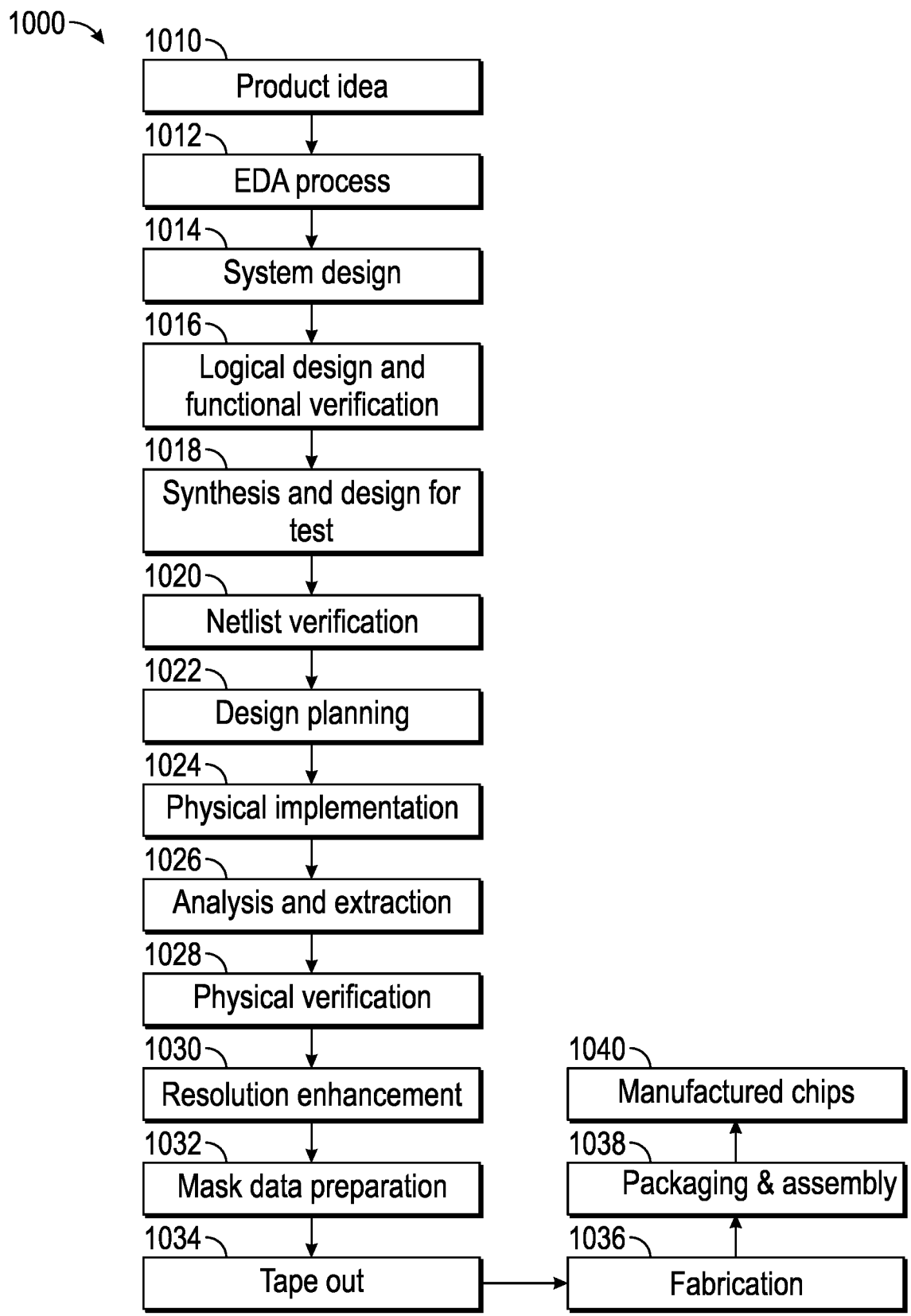
FIG. 10 depicts a flowchart of various processes used during the design and manufacture of an integrated circuit in accordance with some embodiments of the present disclosure.

FIG. 10 illustrates an example set of processes 1000 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1010 with information supplied by a designer, information which is transformed to create an article of manufacture that uses a set of EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed to produce the finished integrated circuit 1040.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 10. The processes described by be enabled by EDA products (or tools).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1026, the circuit function is verified at the layout level, which permits refinement of the layout design. During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the 'tape-out' data is used to produce lithography masks that are used to produce finished integrated circuits.

A storage subsystem of a computer system (such as computer system 1100 of FIG. 11) may be used to store the programs and data structures that are used by some or all of the EDA products described herein, and products used for development of cells for the library and for physical and logical design that use the library.

FIG. 11 illustrates an example machine of a computer system 1100 within which a set of instructions, for causing the machine to perform any one or more of the methodologies discussed herein, may be executed. In alternative implementations, the machine may be connected (e.g., networked)

to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable storage medium having stored thereon instructions, which may be used to program a computer system (or other electronic devices) to perform a process according to the present disclosure. A machine-readable storage medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In one example, a method comprises receiving a digital design file of an integrated circuit (IC) design, and performing direct current (DC) analysis on sub-circuits of the IC design to determine a first defect coverage amount associated with a first plurality of nets of the IC design. The method further comprises identifying a set of sensitive nets from the first plurality of nets based on the first associated defect coverage amounts. Further, the method comprises providing an indication of the set of sensitive nets.

In one example, in response to a combined defect coverage amount of the set of sensitive nets being less than a threshold value, performing transient analysis on the sub-circuits of the IC design to determine second defect coverage amounts associated with a second plurality of nets of the IC design. In one example, the set of sensitive nets is further identified from the second plurality of nets based on the second defect coverage amounts. In one example, a probe point (or node) is added to the IC design corresponding to a first one of the set of sensitive nets.

In one example, the method further comprises identifying the sub-circuits within the IC design. Identifying the sub-circuits comprises generating a channel-connected graph for the plurality of sub-circuits of the IC design, and determining one or more candidate sub-circuits from the plurality of sub-circuits from the channel-connected graph. Further, identifying the sub-circuits comprises identifying one or more sub-circuits from the one or more candidate sub-circuits based on a number of transistors and a number of edges within each of the plurality of sub-circuits, outputting a set of the identified one or more sub-circuits. In one example, identifying the sub-circuits further comprises comparing the number of transistors in each of the plurality of sub-circuits to a first threshold and a second threshold, the second threshold is greater than the first threshold, and comparing the number of edges within each of the plurality of sub-circuits to a third threshold. In one example, identifying one or more sub-circuits comprises identifying a first sub-circuit of the plurality of sub-circuits based on a number of transistors in the first sub-circuit being greater than the first threshold and less than the second threshold, and a number of edges of the first sub-circuit being less than the third threshold.

In one example, a system comprises a memory storing instructions, and a processor, coupled with the memory and configured to execute the instructions. The instructions, when executed, cause the processor to receive a digital design file of an integrated circuit (IC) design, and perform direct current (DC) analysis on sub-circuits of the IC design to determine a first defect coverage amount associated with a first plurality of nets of the IC design. Further, the processor is caused to identify a set of sensitive nets from the first plurality of nets based on the first associated defect coverage amounts. The processor is further caused to provide an indication of the set of sensitive nets.

In one example, in response to a combined defect coverage amount of the set of sensitive nets being less than a threshold value, performing transient analysis on the sub-circuits of the IC design to determine second defect coverage amounts associated with a second plurality of nets of the IC design. In one example, the set of sensitive nets is further identified from the second plurality of nets based on the second defect coverage amounts. In one example, a probe point (or node) is added to the IC design corresponding to a first one of the set of sensitive nets.

In one example, the processor is further caused to identify the sub-circuits within the IC design. Identifying the sub-circuits comprises generating a channel-connected graph for the plurality of sub-circuits of the IC design, and determining one or more candidate sub-circuits from the plurality of sub-circuits from the channel-connected graph. Further, identifying the sub-circuits comprises identifying one or more sub-circuits from the one or more candidate sub-circuits based on a number of transistors and a number of edges within each of the plurality of sub-circuits, outputting a set of the identified one or more sub-circuits. In one example, identifying the sub-circuits further comprises comparing the number of transistors in each of the plurality of sub-circuits to a first threshold and a second threshold, the second threshold is greater than the first threshold, and comparing the number of edges within each of the plurality of sub-circuits to a third threshold. In one example, identifying one or more sub-circuits comprises identifying a first sub-circuit of the plurality of sub-circuits based on a number of transistors in the first sub-circuit being greater than the first threshold and less than the second threshold, and a number of edges of the first sub-circuit being less than the third threshold.

In one example, a non-transistor computer readable medium comprises stored instructions, which when executed by a processor cause the processor to receive a digital design file of an integrated circuit (IC) design, and perform direct current (DC) analysis on sub-circuits of the IC design to determine a first defect coverage amount associated with a first plurality of nets of the IC design. Further, the processor is caused to identify a set of sensitive nets from the first plurality of nets based on the first associated defect coverage amounts. The processor is further caused to provide an indication of the set of sensitive nets.

In one example, in response to a combined defect coverage amount of the set of sensitive nets being less than a threshold value, performing transient analysis on the sub-circuits of the IC design to determine second defect coverage amounts associated with a second plurality of nets of the IC design. In one example, the set of sensitive nets is further identified from the second plurality of nets based on the second defect coverage amounts. In one example, a probe point is added to the IC design corresponding to a first one of the set of sensitive nets.

In one example, the processor is further caused to identify the sub-circuits within the IC design. Identifying the sub-circuits comprises generating a channel-connected graph for the plurality of sub-circuits of the IC design, and determining one or more candidate sub-circuits from the plurality of sub-circuits from the channel-connected graph. Further, identifying the sub-circuits comprises identifying one or more sub-circuits from the one or more candidate sub-circuits based on a number of transistors and a number of edges within each of the plurality of sub-circuits, outputting a set of the identified one or more sub-circuits. In one example, identifying the sub-circuits further comprises comparing the number of transistors in each of the plurality of sub-circuits to a first threshold and a second threshold, the second threshold is greater than the first threshold, and comparing the number of edges within each of the plurality of sub-circuits to a third threshold. In one example, identifying one or more sub-circuits comprises identifying a first sub-circuit of the plurality of sub-circuits based on a number of transistors in the first sub-circuit being greater than the first threshold and less than the second threshold, and a number of edges of the first sub-circuit being less than the third threshold.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving an integrated circuit (IC) design;
   generating, by one or more processors, a graph based on a plurality of sub-circuits of the IC design;
   determining, by the one or processors, one or more candidate sub-circuits from the plurality of sub-circuits based on the graph;
   identifying, by the one or more processors, one or more sub-circuits from the one or more candidate sub-circuits based on a number of transistors and a number of edges within each of the plurality of sub-circuits; and
   providing an indication of the identified one or more sub-circuits.

2. The method of claim 1, wherein identifying the one or more sub-circuits comprises:
   comparing the number of transistors in each of the plurality of sub-circuits to a first threshold and a second threshold, the second threshold is greater than the first threshold; and
   comparing the number of edges within each of the plurality of sub-circuits to a third threshold.

3. The method of claim 2, wherein identifying the one or more sub-circuits comprises identifying a first sub-circuit of the plurality of sub-circuits based on a number of transistors of the first sub-circuit being greater than the first threshold and less than the second threshold, and a number of edges of the first sub-circuit being less than the third threshold.

4. The method of claim 1, wherein generating the graph for the plurality of sub-circuits comprises:
   detecting channel-connected blocks based on nodes of the plurality of sub-circuits; and
   placing a directed edge between an output of a first channel-connected block of the channel-connected blocks and an input of a second channel-connected block of the channel-connected blocks.

5. The method of claim 1 further comprises:
   performing direct current (DC) analysis on the identified one or more sub-circuits to determine a first defect coverage amount associated with a first plurality of nets of the IC design; and
   identifying a set of sensitive nets from the first plurality of nets based on the first defect coverage amounts.

6. The method of claim 5 further comprises, based on a combined defect coverage amount of the set of sensitive nets being less than a threshold value, performing transient analysis on the sub-circuits of the IC design to determine second defect coverage amounts associated with a second plurality of nets of the IC design.

7. The method of claim 6, wherein the set of sensitive nets is further identified from the second plurality of nets based on the second defect coverage amounts.

8. A system comprising:
   a memory storing instructions; and
   a processor, coupled with the memory and configured to execute the instructions, the instructions when executed cause the processor to:
      receive a digital design file of an integrated circuit (IC) design;
      generate a channel-connected graph based on a plurality of sub-circuits of the IC design;
      determine one or more candidate sub-circuits from the plurality of sub-circuits from the channel-connected graph;
      identify one or more sub-circuits from the one or more candidate sub-circuits based on a number of transistors and a number of edges within each of the plurality of sub-circuits; and
      output an indication of the identified one or more sub-circuits.

9. The system of claim 8, wherein identifying the one or more sub-circuits comprises:
   comparing the number of transistors in each of the plurality of sub-circuits to a first threshold and a second threshold, the second threshold is greater than the first threshold; and
   comparing the number of edges within each of the plurality of sub-circuits to a third threshold.

10. The system of claim 9, wherein identifying the one or more sub-circuits comprises identifying a first sub-circuit of the plurality of sub-circuits based on a number of transistors the first sub-circuit being greater than the first threshold and less than the second threshold, and a number of edges of the first sub-circuit being less than the third threshold.

11. The system of claim 8, wherein generating the channel-connected graph for the plurality of sub-circuits comprises:
   detecting channel-connected blocks based on nodes of the plurality of sub-circuits; and
   placing a directed edge between an output of a first channel-connected block of the channel-connected blocks and an input of a second channel-connected block of the channel-connected blocks.

12. The system of claim 8, wherein the instructions when executed cause the processor to further:
   perform direct current (DC) analysis on the identified one or more sub-circuits to determine a first defect coverage amount associated with a first plurality of nets of the IC design; and
   identify a set of sensitive nets from the first plurality of nets based on the first defect coverage amounts.

13. The system of claim 12, wherein, based on a combined defect coverage amount of the set of sensitive nets being less than a threshold value, performing transient analysis on the sub-circuits of the IC design to determine second defect coverage amounts associated with a second plurality of nets of the IC design.

14. The system of claim 13, wherein the set of sensitive nets is further identified from the second plurality of nets based on the second defect coverage amounts.

15. A non-transitory computer readable medium comprising stored instructions, which when executed by a processor, cause the processor to:
   receive an integrated circuit (IC) design;
   generate a graph for a plurality of sub-circuits of the IC design;
   determine one or more candidate sub-circuits from the plurality of sub-circuits from the graph;

identify one or more sub-circuits from the one or more candidate sub-circuits based on a number of transistors and a number of edges within each of the plurality of sub-circuits; and provide an indication of the identified one or more sub-circuits.

16. The non-transitory computer readable medium of claim 15, wherein identifying the one or more sub-circuits comprises:

comparing the number of transistors in each of the plurality of sub-circuits to a first threshold and a second threshold, the second threshold is greater than the first threshold; and comparing the number of edges within each of the plurality of sub-circuits to a third threshold.

17. The non-transitory computer readable medium of claim 16, wherein identifying the one or more sub-circuits comprises identifying a first sub-circuit of the plurality of sub-circuits based on a number of transistors the first sub-circuit being greater than the first threshold and less than the second threshold, and a number of edges of the first sub-circuit being less than the third threshold.

18. The non-transitory computer readable medium of claim 15, wherein generating the graph for the plurality of sub-circuits comprises:

detecting channel-connected blocks based on nodes of the plurality of sub-circuits; and placing a directed edge between an output of a first channel-connected block of the channel-connected blocks and an input of a second channel-connected block of the channel-connected blocks.

19. The non-transitory computer readable medium of claim 15, wherein the processor is further caused to:

perform direct current (DC) analysis on the identified one or more sub-circuits to determine a first defect coverage amount associated with a first plurality of nets of the IC design; and identify a set of sensitive nets from the first plurality of nets based on the first defect coverage amounts.

20. The non-transitory computer readable medium of claim 19, wherein, based on a combined defect coverage amount of the set of sensitive nets being less than a threshold value, performing transient analysis on the sub-circuits of the IC design to determine second defect coverage amounts associated with a second plurality of nets of the IC design.

* * * * *